(12) United States Patent
Sugahara et al.

(10) Patent No.: US 10,304,508 B2
(45) Date of Patent: May 28, 2019

(54) MAGNETORESISTIVE ELEMENT AND MEMORY CIRCUIT INCLUDING A FREE LAYER

(71) Applicant: JAPAN SCIENCE AND TECHNOLOGY AGENCY, Kawaguchi-shi, Saitama (JP)

(72) Inventors: Satoshi Sugahara, Tokyo (JP); Yota Takamura, Tokyo (JP); Shigeki Nakagawa, Tokyo (JP)

(73) Assignee: JAPAN SCIENCE AND TECHNOLOGY AGENCY, Kawaguchi-shi (JP)

( * ) Notice: Subject to any disclaimer, the term of this patent is extended or adjusted under 35 U.S.C. 154(b) by 0 days.

(21) Appl. No.: 15/578,377

(22) PCT Filed: May 31, 2016

(86) PCT No.: PCT/JP2016/065964
§ 371 (c)(1),
(2) Date: Nov. 30, 2017

(87) PCT Pub. No.: WO2016/194886
PCT Pub. Date: Dec. 8, 2016

(65) Prior Publication Data
US 2018/0158496 A1    Jun. 7, 2018

(30) Foreign Application Priority Data

Jun. 3, 2015 (JP) .................................. 2015-113515

(51) Int. Cl.
*G11C 11/16* (2006.01)
*H01L 43/08* (2006.01)
(Continued)

(52) U.S. Cl.
CPC ............ *G11C 11/161* (2013.01); *G11C 11/14* (2013.01); *G11C 11/1659* (2013.01);
(Continued)

(58) Field of Classification Search
CPC .............. G11C 11/161; G11C 11/1675; G11C 11/1659; G11C 11/1693; G11C 11/14;
(Continued)

(56) References Cited

U.S. PATENT DOCUMENTS 6,483,741 B1    11/2002   Iwasaki et al.
8,406,042 B2 *   3/2013   Zhu ........................ B82Y 25/00
                                                      257/421
(Continued)

FOREIGN PATENT DOCUMENTS

JP    2001-84756 A    3/2001
JP    2006-179891 A   7/2006
(Continued)

OTHER PUBLICATIONS

Iwasaki et al., "Stress-Driven Magnetization Switching: Possible Mechanism for Magnetic Writing without Application of an External Magnetic Field", Journal of the Magnetics Society of Japan, 2005, vol. 29, No. 5, pp. 529-534, w/English partial translation (8 pages).
(Continued)

*Primary Examiner* — David Lam
(74) *Attorney, Agent, or Firm* — Westerman, Hattori, Daniels & Adrian, LLP

(57) ABSTRACT

A magnetoresistive element includes: a free layer that includes a magnetostrictive layer containing a magnetostrictive material; a pin layer that includes a first ferromagnetic layer; a thin film that is located between the pin layer and the free layer; a piezoelectric substance that is located so as to surround at least a part of the magnetostrictive layer from a
(Continued)

direction intersecting with a stacking direction of the free layer and the pin layer and applies a pressure to the magnetostrictive layer; and an electrode that is capable of applying a voltage different from a voltage applied to the free layer and a voltage applied to the pin layer and applies a voltage to the piezoelectric substance so that the piezoelectric substance applies a pressure to the magnetostrictive layer.

15 Claims, 29 Drawing Sheets

(51) Int. Cl.
    *H01L 27/105*    (2006.01)
    *H01L 29/82*    (2006.01)
    *H01L 41/09*    (2006.01)
    *G11C 11/14*    (2006.01)
    *H01L 27/22*    (2006.01)

(52) U.S. Cl.
    CPC ...... *G11C 11/1675* (2013.01); *G11C 11/1693* (2013.01); *H01L 27/105* (2013.01); *H01L 27/228* (2013.01); *H01L 29/82* (2013.01); *H01L 41/09* (2013.01); *H01L 43/08* (2013.01)

(58) Field of Classification Search
    CPC ....... H01L 27/228; H01L 43/08; H01L 41/09; H01L 29/82; H01L 27/105
    See application file for complete search history.

(56) References Cited

U.S. PATENT DOCUMENTS

| | | | |
|---|---|---|---|
| 2003/0146469 A1 | 8/2003 | Matsuoka et al. | |
| 2005/0106810 A1* | 5/2005 | Pakala | B82Y 10/00 438/257 |
| 2006/0133137 A1 | 6/2006 | Shin et al. | |
| 2007/0099031 A1* | 5/2007 | Chung | G01L 19/16 428/815 |
| 2010/0080048 A1 | 4/2010 | Liu et al. | |
| 2011/0194361 A1 | 8/2011 | Kawahara et al. | |
| 2012/0245477 A1* | 9/2012 | Giddings | G01R 33/091 600/485 |
| 2013/0064011 A1* | 3/2013 | Liu | G11C 11/16 365/173 |
| 2014/0269033 A1 | 9/2014 | Natori et al. | |
| 2015/0070974 A1 | 3/2015 | Shuto et al. | |

FOREIGN PATENT DOCUMENTS

| | | |
|---|---|---|
| JP | 2012-9786 A | 1/2012 |
| WO | 2010/039422 A1 | 4/2010 |
| WO | 2010/041632 A1 | 4/2010 |
| WO | 2013/090937 A1 | 6/2013 |
| WO | 2013/172066 A1 | 11/2013 |

OTHER PUBLICATIONS

International Search Report dated Aug. 23, 2016, issued in counterpart International Application No. PCT/JP2016/065964 (2 pages).
Partial (Supplementary) European Search Report dated Apr. 30, 2018, issued in counterpart application No. 16803321.5. (15 pages).
Extended European Search Report dated Jul. 31, 2018, issued in counterpart application No. 16803321.5. (12 pages).

* cited by examiner

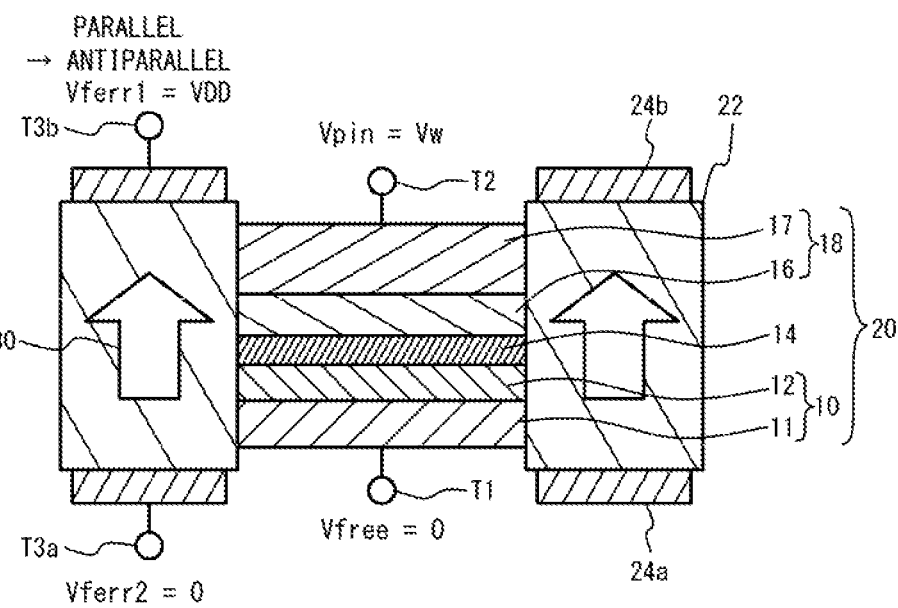
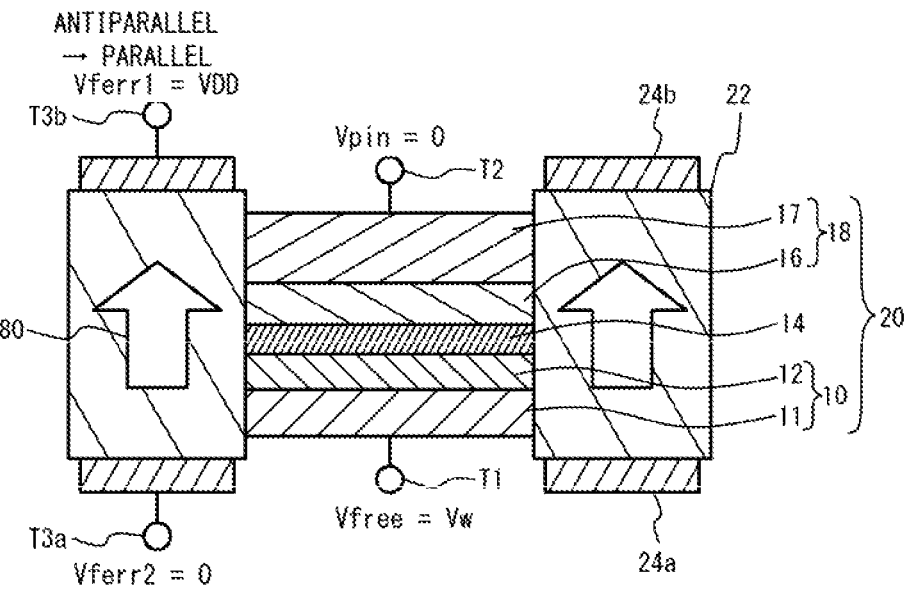

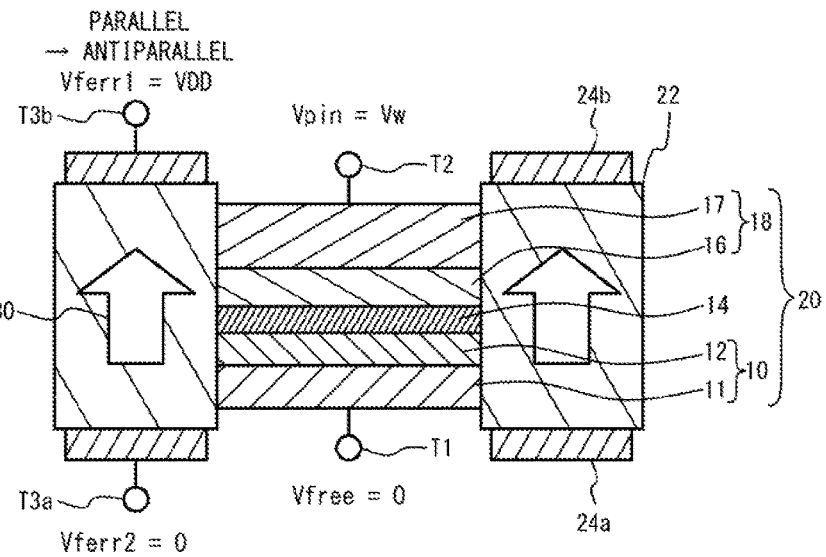
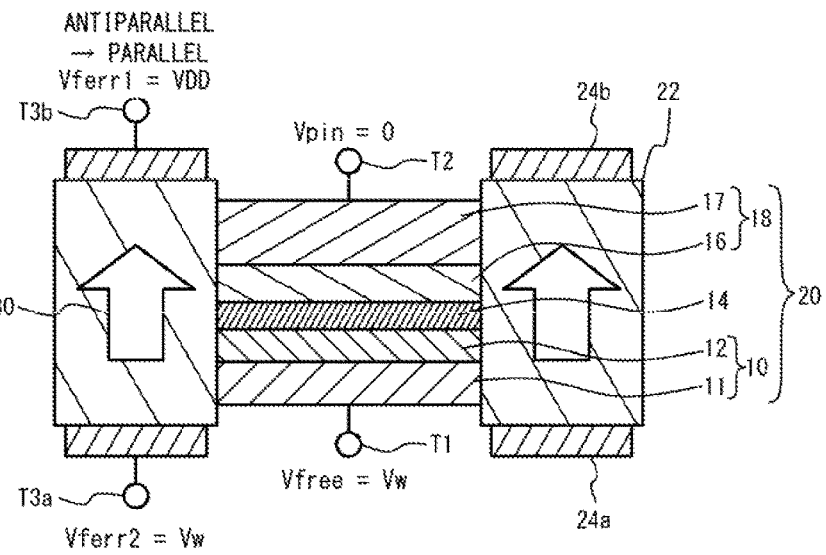

MAGNETORESISTIVE ELEMENT AND MEMORY CIRCUIT INCLUDING A FREE LAYER

TECHNICAL FIELD

The present invention relates to a magnetoresistive element and a memory circuit, and relates to, for example, a magnetoresistive element and a memory circuit including a free layer.

BACKGROUND ART

Magnetic tunnel junctions (MTJs), which are a type of magnetoresistive elements, have been researched and developed as a memory element for the magnetoresistive random access memory (MRAM), which is a nonvolatile memory. It is also expected to be applied to a low power logic architecture such as power gating utilizing a nonvolatile memory (nonvolatile power gating: NVPG) (Patent Document 1). The MTJ includes a free layer of which the magnetization direction is able to be changed and a pin layer of which the magnetization direction is fixed.

FIG. 4 of Patent Document 2 describes that a piezoelectric substance is located on the circumference surface of a cylindrical memory element laminated body and a metal film is located on the circumference surface of the piezoelectric substance.

PRIOR ART DOCUMENT

Patent Document

Patent Document 1: International Publication No. 2013/172066
Patent Document 2: Japanese Patent Application Publication No. 2012-9786

SUMMARY OF THE INVENTION

Problem to be Solved by the Invention

Spin-transfer-torque current-induced magnetization switching (STT-CIMS) is widely used to reverse the magnetization of the free layer of the MTJ. In STT-CIMS, the current of spin-polarized electrons flowing through the MTJ causes the magnetization to be subject to a torque, and thereby reversing the magnetization. The threshold current density necessary for magnetization reversal is Jc. Generally, Jc is large, $10^6$ A/cm$^2$ or so. To reduce Jc, the energy burrier relating to the magnetization reversal is reduced. However, in this case, problems such as deterioration of the thermal disturbance resistance during retention of information and increase in probability of erroneous writing occur. Thus, it may be considered to conduct STT-CIMS by applying an external stimulus such as heat or high frequency voltage to change the shape/height of the effective energy burlier only when reversing the magnetization. The use of this method enables to reduce Jc without deteriorating the thermal disturbance resistance and the like. However, the energy consumption for the external stimulus is not small, and even if Jc is reduced, the reduction of total energy consumption is not easy because of the energy consumption for the external stimulus. As described above, the reduction of the energy consumption for changing the magnetization direction of the free layer is desired.

Patent Document 2 describes that when a voltage is applied to the metal film, a compressing pressure is applied to the memory layer (the free layer) in the memory element laminated body, the coercivity of the memory layer decreases due to the inverse magnetostrictive effect, and thereby the spin injection current is reduced.

However, the metal film is electrically connected to a lower electrode for causing current to flow through the memory element laminated body. In such a structure, when a current in the reverse direction is caused to flow through the memory element laminated body, the piezoelectric substance does not apply a compression pressure to the memory layer. Therefore, the spin injection current is not reduced.

The present invention has been made in view of the above problems, and aims to reduce the energy consumption for changing the magnetization direction of a free layer.

Means for Solving the Problem

The present invention is a magnetoresistive element characterized by including: a free layer that includes a magnetostrictive layer containing a magnetostrictive material; a pin layer that includes a first ferromagnetic layer; a thin film that is located between the pin layer and the free layer; a piezoelectric substance that is located so as to surround at least a part of the magnetostrictive layer from a direction intersecting with a stacking direction of the free layer and the pin layer and applies a pressure to the magnetostrictive layer; and an electrode that is capable of applying a voltage different from a voltage applied to the free layer and a voltage applied to the pin layer and applies a voltage to the piezoelectric substance so that the piezoelectric substance applies a pressure to the magnetostrictive layer.

In the above structure, the electrode may be located so as to surround at least a part of the piezoelectric substance, and the piezoelectric substance may be dielectrically polarized in a direction from the magnetostrictive layer to the electrode or a direction from the electrode to the magnetostrictive layer.

In the above structure, the electrode may include a first electrode and a second electrode located at both sides in the stacking direction with respect to the piezoelectric substance, and the piezoelectric substance may be dielectrically polarized in the stacking direction.

In the above structure, when a polarity of a voltage applied to the pin layer with respect to the free layer reverses, a polarity of a voltage applied to the electrode with respect to the free layer may not change.

In the above structure, when a polarity of a voltage applied to the pin layer with respect to the free layer reverses, a polarity of a voltage applied to the second electrode with respect to the first electrode may not change.

In the above structure, the free layer may include a second ferromagnetic layer magnetically coupled to the magnetostrictive layer.

In the above structure, the magnetostrictive layer may change a direction of a magnetization easy axis thereof by application of pressure and reverse a magnetization direction of the free layer.

In the above structure, the magnetization direction of the free layer may be reversed by spin-transfer-torque current-induced magnetization switchin when the direction of the magnetization easy axis of the magnetostrictive layer changes.

In the above structure, the thin film may include a tunnel barrier insulating layer or a non-magnetic metal layer.

In the above structure, the thin film may include a piezoresistor, and the piezoelectric substance may apply a pressure to the piezoresistor.

The present invention is a memory circuit characterized by including: the above magnetoresistive element a bit line to which one of the free layer and the pin layer is coupled; a switch coupled to another of the free layer and the pin layer; a source line coupled to the another of the free layer and the pin layer through the switch; a word line to which a control terminal controlling the switch is coupled; and a control line to which the electrode is coupled.

The present invention is a memory circuit characterized by including: the above magnetoresistive element; a bit line to which one of the free layer and the pin layer is coupled; a source line coupled to another of the free layer and the pin layer; and a word line coupled to the electrode.

The present invention is a memory circuit characterized by including: a magnetoresistive element including: a free layer that includes a magnetostrictive layer containing a magnetostrictive material; a pin layer that includes a first ferromagnetic layer; a thin film that is located between the pin layer and the free layer; a piezoelectric substance that is located so as to surround at least a part of the magnetostrictive layer from a direction intersecting with a stacking direction of the free layer and the pin layer, and applies a pressure to the magnetostrictive layer; and an electrode that is capable of applying a voltage different from a voltage applied to the free layer and a voltage applied to the pin layer, and applies a voltage to the piezoelectric substance so that the piezoelectric substance applies a pressure to the magnetostrictive layer; and a transistor including: a source and a drain, one of the source and the drain being coupled to one of the free layer and the pin layer; a channel that is located between the source and the drain and through which a carrier conducts from the source to the drain; and a gate that surrounds at least a part of the channel from the intersecting direction, wherein the source, the channel, and the drain are stacked in the stacking direction.

In the above structure, the channel may be a piezoresistor, and the gate may include a piezoelectric substance that applies a pressure to the channel from a direction intersecting with a direction in which the carrier conducts.

EFFECTS OF THE INVENTION

The present invention enables to reduce the energy consumption for changing the magnetization direction of a free layer.

BRIEF DESCRIPTION OF THE DRAWINGS

FIG. 7A and FIG. 7B are diagrams for describing an operation in the first variation of the second embodiment;

FIG. 8A and FIG. 8B are diagrams for describing another operation in the first variation of the second embodiment;

MODES FOR CARRYING OUT THE EMBODIMENTS

Hereinafter, a description will be given of embodiments with respect to the accompanying drawings.

First Embodiment

Figure 1:
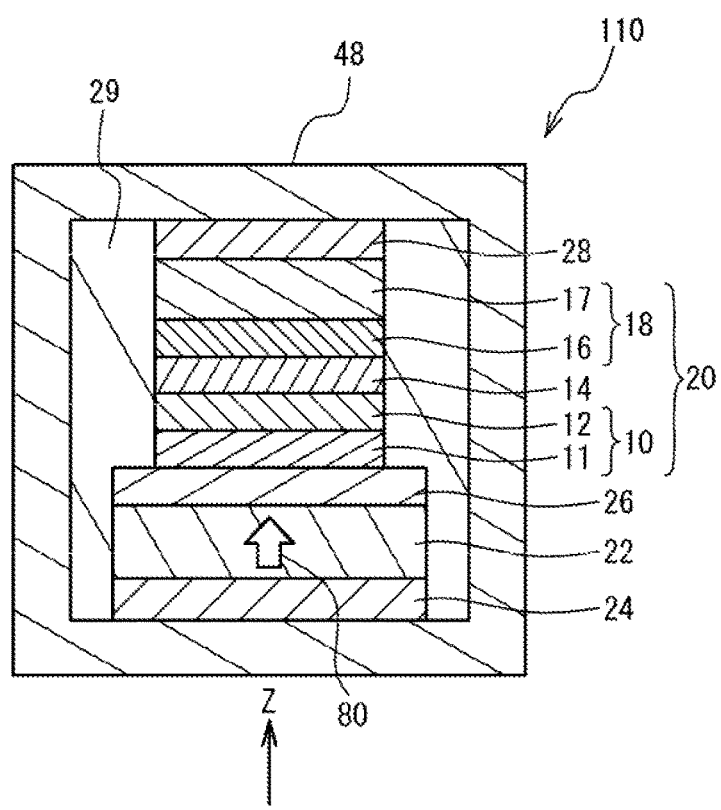
FIG. 1 is a cross-sectional view of a nonvolatile memory element in accordance with a first embodiment.

A first embodiment s an exemplary magnetoresistive element utilizing a magnetic tunnel junction MTJ. FIG. 1 is a cross-sectional view of a nonvolatile memory element in accordance with the first embodiment. As illustrated in FIG. 1, in a nonvolatile memory element 110, a piezoelectric electrode 24, a piezoelectric substance 22, a free layer electrode 26, a magnetoresistive layer 20, and a pin layer electrode 28 are stacked in a stacking direction z. The laminated body from the piezoelectric electrode 24 to the pin layer electrode 28 is supported by a support structure 48 made of a high yield strength material. The support structure 48 is formed of a material having Young's modulus greater than and a yield strength higher than those of the piezoelectric electrode 24, the piezoelectric substance 22, the free layer electrode 26, the magnetoresistive layer 20, and the pin layer electrode 28. A low Young's modulus region 29 is located around the piezoelectric electrode 24, the piezoelectric substance 22, the free layer electrode 26, the free layer 10, a tunnel barrier layer 14, a pin layer 18, and the pin layer electrode 28. The low Young's modulus region 29 is a region having Young's modulus less than those of the piezoelectric electrode 24, the piezoelectric substance 22, the free layer electrode 26, the magnetoresistive layer 20, and the pin layer electrode 28, and is made of, for example, an air gap or an organic material such as resin or the like. The magnetoresistive layer 20 includes a free layer 10, the tunnel barrier layer 14, and the pin layer 18.

The free layer 10 includes a ferromangetic layer 12 and a magnetostrictive layer 11. The pin layer 18 includes a ferromagnetic layer 16 and a magnetization fixed layer 17. The tunnel barrier layer 14 is sandwiched between the ferromagnetic layers 12 and 16. The ferromagnetic lavers 12 and 16 are layers containing a ferromagnetic substance and having a high spin polarization. The magnetostrictive layer 11 contains a magnetostrictive material. The magnetostrictive material has the inverse magnetostrictive effect that the magnetic anisotropy inside the material changes when a pressure is applied. The magnetostrictive layer 11 is magnetically coupled to the ferromagnetic layer 12. Thus, the magnetization directions of the magnetostrictive layer 11 and the ferromagnetic layer 12 are reversed all at once. The magnetization fixed layer 17 contains a hard magnetic material or antiferromagnetic substance having a volume greater than those of the ferromagnetic layers 12 and 16. Thus, the magnetization direction of the magnetization fixed layer 17 is not easily reversed. The ferromagnetic layer 16 is magnetically coupled (for example, exchange coupling) to the magnetization fixed layer 17. Thus, the magnetization direction of the ferromagnetic layer 16 is also difficult to reverse.

The free layer electrode 26 is electrically connected to the free layer 10. The pin layer electrode 28 is electrically connected to the pin layer 18. The piezoelectric substance 22 is dielectrically polarized in the +z direction as in a direction 80 of the dielectric polarization. When the piezoelectric electrode 24 applies a voltage to the piezoelectric substance 22 with respect to the free layer electrode 26, the piezoelectric substance 22 applies a pressure to the magnetostrictive layer 11. The direction of the pressure is in the +z direction. The resistance between the free layer electrode 26 and the pin layer electrode 28 of the magnetoresistive layer 20 varies depending on the magnetization direction of the ferromagnetic layer 12. The magnetization direction of the ferromagnetic layer 12 is reversed by, for example, STT-CIMS.

In the first embodiment, the piezoelectric substance 22 applies a pressure to the magnetostrictive layer 11 by a voltage applied to the piezoelectric electrode 24 with respect to the free layer electrode 26. The magnetization of the ferromagnetic layer 12 is reversed while the pressure is being applied. This reduces the threshold current density Jc for the magnetization reversal.

Figure 2A:
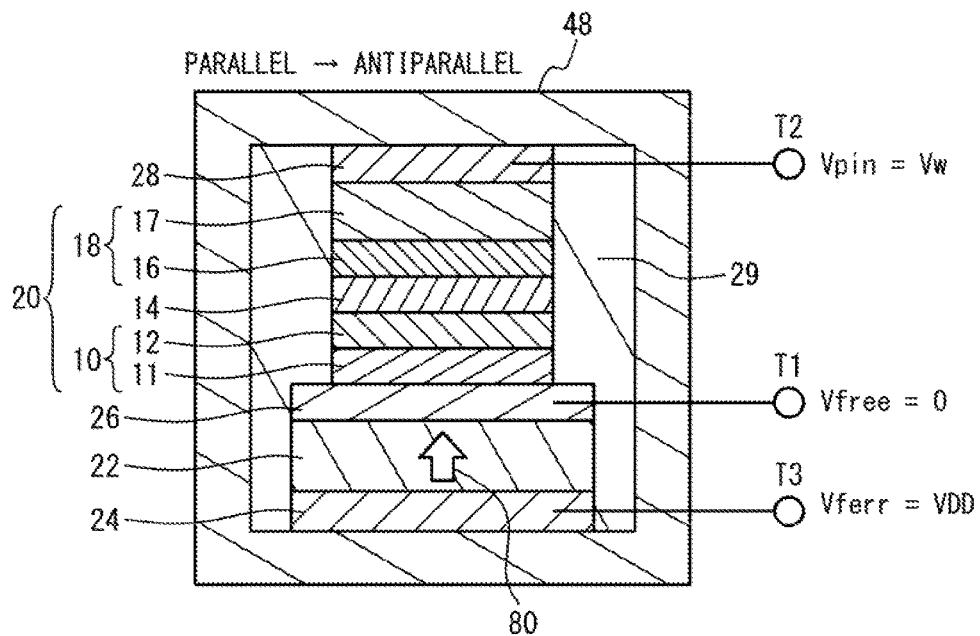
FIG. 2A and FIG. 2B are diagrams for describing an operation in the first embodiment.
Figure 2B:
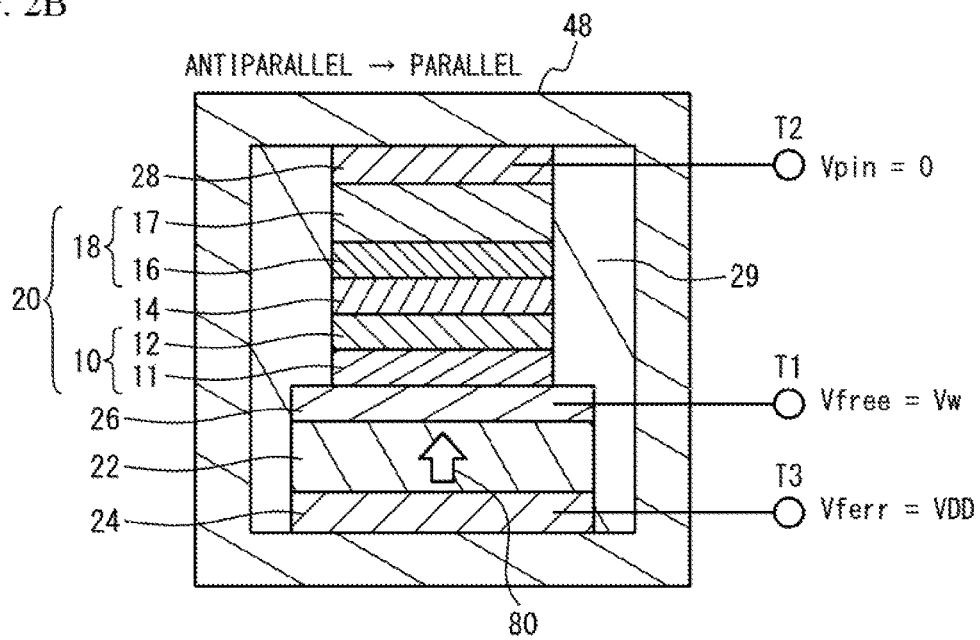

FIG. 2A and FIG. 2B are diagrams for describing an operation in the first embodiment. A voltage applied from a terminal T1 to the free layer 10 is represented by Vfree, a voltage applied from a terminal T2 to the pin layer 18 is represented by Vpin, and a voltage applied from a terminal T3 to the piezoelectric electrode 24 is represented by Vferr. The power source voltage is represented by VDD and a voltage for writing is represented by Vw (which is assumed to be a positive voltage, hereinafter). The state where the magnetization direction of the free layer 10 is parallel to that of the pin layer 18 is referred to as a parallel state, and the state where the magnetization direction of the free layer 10 is opposite to that of the pin layer 18 is referred to as err antiparallel state.

As illustrated in FIG. 2A, when the parallel state is rewritten to the antiparallel state, each voltage is configured as Vfree=0 V and Vpin=Vw. When Vferr=0 V. the magnetization direction of the free layer 10 is biased toward the antiparallel state by typical STT. In the first embodiment, Vferr is configured to be equal to VDD. The voltage VDD with respect to the terminal T1 is applied to the piezoelectric electrode 24. The piezoelectric substance 22 applies a pressure in the +z direction to the magnetostrictive layer 11. When the magnetization direction is in the z direction and the magnetostrictive coefficient of the magnetostrictive layer 11 is positive, the magnetization easy plane of the magnetostrictive layer 11 is in an xy plane. Thus, the magnetization direction of the free layer 10 is reversed by small current, and becomes in the antiparallel state.

As illustrated in FIG. 2B when the antiparallel state is rewritten to the parallel state, each voltage is configured as Vfree=Vw and Vpin=0 V. When Vferr=0 V, the magnetization direction of the free layer 10 is biased toward the parallel state by typical STT. In the first embodiment, Vferr is configured to be equal to VDD. The voltage VDD−Vw with respect to the terminal T1 is applied to the piezoelectric electrode 24. Here, Vw is set so that VDD−Vw>0 V. The piezoelectric substance 22 applies a pressure in the −z direction to the magnetostrictive layer 11. Since the magnetization easy plane becomes in the xy plane, the magnetization direction of the free layer 10 is reversed by small current, and becomes in the parallel state.

In FIG. 2A and FIG. 2B, since the direction 80 of the dielectric polarization is in the +z direction, each voltage is set that Vferr is positive with respect to Vfree when the magnetization direction is reversed. When the direction 80 of the dielectric polarization is in the −z direction, each voltage is set so that Vferr is negative with respect to Vfree when the magnetization direction is reversed. As described above, it is only required that the piezoelectric substance is dielectrically polarized in the +z direction or the −z direction.

In the first embodiment, the magnetostrictive layer 11 is magnetically coupled to the ferromagnetic layer 12. When the piezoelectric electrode 24 applies a voltage to the piezoelectric substance 22, the piezoelectric substance 22 applies a pressure to the magnetostrictive layer 11. Thus, the magnetostrictive layer 11 changes the direction of the magnetization easy axis thereof by the application of the pressure, and reverses the magnetization direction of the free layer 10. Therefore, the current flowing through the magnetoresistive layer 20 when the magnetization direction of the free layer 10 is changed is reduced. Accordingly, the consumption energy is reduced.

As described in the first embodiment, when the piezoelectric substance 22 applies a pressure to the magnetostrictive layer 11 in the stacking direction, the support structure 48 (a support) supports the piezoelectric substance 22 and the magnetostrictive layer 11 from both sides in the stacking direction. This structure allows a pressure from the piezoelectric substance 22 to be applied efficiently to the magnetostrictive layer 11. All sides in vertical and horizontal directions of the laminated body from the piezoelectric electrode 24 to the pin layer electrode 28 are preferably surrounded by the support structure 48.

Second Embodiment

The first embodiment uses the support structure 48 because the piezoelectric substance 22 applies a pressure to the magnetostrictive layer 11. In a second embodiment described hereinafter, the free layer 10 includes the magnetostrictive layer 11 made of a super magnetostrictive material. The magnetostrictive layer 11 is surrounded by the piezoelectric substance 22. In this structure, a pressure is able to be applied to the magnetostrictive layer 11 from the piezoelectric substance 22 without using the support structure 48 made of a high yield strength material or the like. The pressure strains the magnetostrictive layer 11. The inverse magnetostrictive effect changes the magnetic anisotropy inside the magnetostrictive layer 11. The magnetization reversal operation at low voltage drive/low current density is achieved by combining the change of the magnetic anisotropy in the magnetostrictive layer 11 caused by the pressure and the spin-transfer-torque given to the magnetization by the spin polarized current flowing through the magnetoresistive element.

Figure 3A:
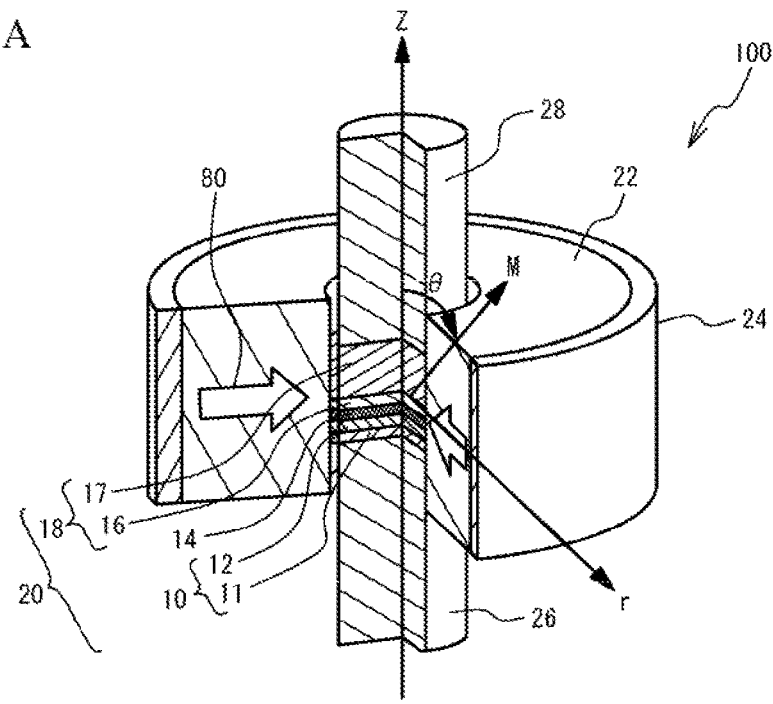
FIG. 3A is a perspective view of a nonvolatile memory element in accordance with a second embodiment.
Figure 3B:
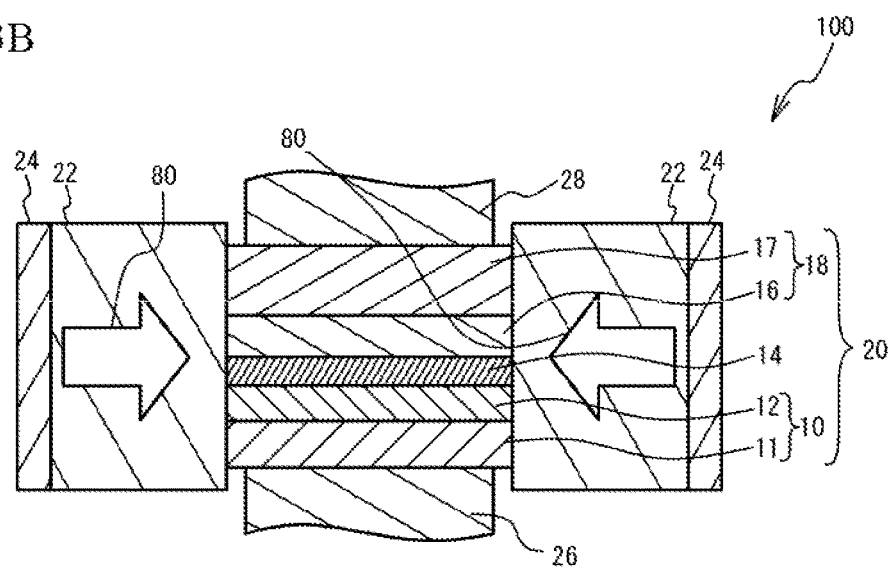
FIG. 3B is a cross-sectional view.

FIG. 3A is a perspective view of a nonvolatile memory element in accordance with the second embodiment, and FIG. 3B is a cross-sectional view. As illustrated in FIG. 3A and FIG. 3B, in a nonvolatile memory element 100, the magnetoresistive layer 20 is a magnetic tunnel junction element and has a cylindrical shape. The central axis of the magnetoresistive layer 20 is defined as a z-axis, the radial direction is defined as r direction, the plane including the radial direction is defined as an xy plane, and the angle between the magnetization direction M of the free layer 10 and the z-axis is defined as θ.

The magnetoresistive layer 20 includes the free layer 10, the tunnel barrier layer 14, and the pin layer 18. The free layer 10 includes the ferromagnetic layer 12 (a second ferromagnetic layer) and the magnetostrictive layer 11. The pin layer 18 includes the ferromagnetic layer 16 (a first ferromagnetic layer) and the magnetization fixed layer 17. The tunnel barrier layer 14 is sandwiched between the ferromagnetic layers 12 and 16. The ferromagnetic layers 12 and 16 are layers containing a ferromagnetic substance and having a high spin polarization. The magnetostrictive layer 11 contains a niagnetostrictive material. The magnetostrictive material has the inverse magnetostrictive effect that the magnetic anisotropy inside the material changes when a pressure is applied. The magnetostrictive layer 11 is magnetically coupled to the ferromagnetic layer 12. Accordingly, the magnetization directions of the magnetostrictive layer 11 and the ferromagnetic layer 12 are reversed all at once. The magnetization fixed layer 17 contains a hard magnetic material or antiferromagnetic substance having a volume greater than those of the ferromagnetic layers 12 and 16. Accordingly, the magnetization direction of the magnetization fixed layer 17 is not easily reversed. The ferromagnetic layer 16 is magnetically coupled to the magnetization fixed layer 17. Thus, the magnetization direction of the ferromagnetic layer 16 is also difficult to reverse.

The free layer electrode 26 is electrically connected to the free layer 10. The pin layer electrode 28 is electrically connected to the pin layer 18. The piezoelectric substance 22 surrounds the magnetoresistive layer 20, and is dielectrically polarized in the −r direction as in the direction 80 of the dielectric polarization. The piezoelectric electrode 24 is located so as to surround the piezoelectric substance 22. When the piezoelectric electrode 24 applies a voltage to the piezoelectric substance 22, the piezoelectric substance 22 applies, a pressure to the magnetostrictive layer 11. The direction of the pressure is in the −r direction. In FIG. 3A and FIG. 3B, the piezoelectric substance 22 applies a pressure to the magnetoresistive layer 20. However, it is only required that the piezoelectric substance 22 applies a pressure to at least the magnetostrictive layer 11.

Figure 4A:
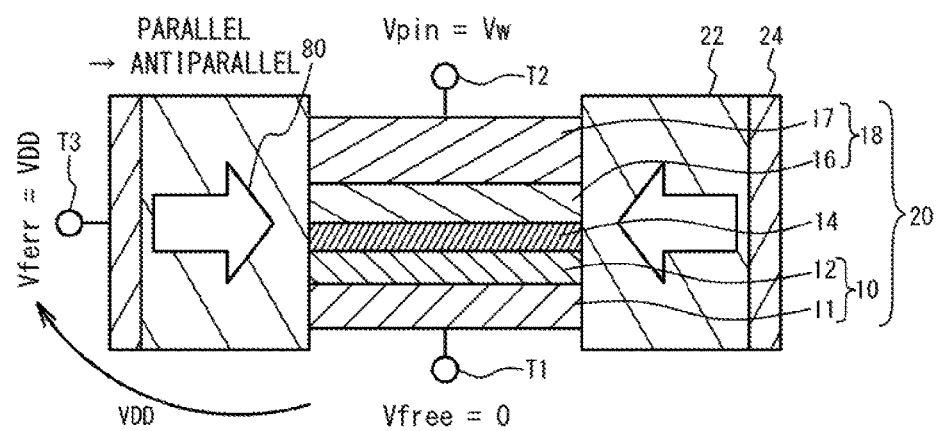
FIG. 4A and FIG. 4B are diagrams for describing an operation in the second embodiment.
Figure 4B:
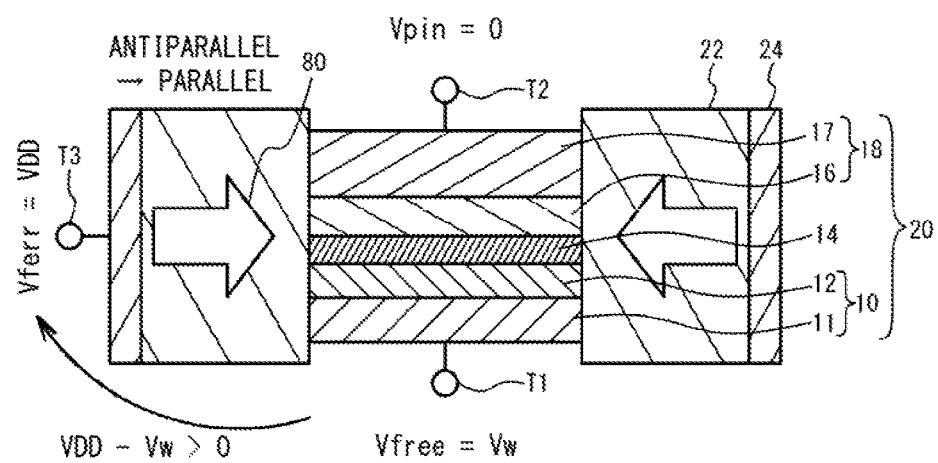

FIG. 4A and FIG. 4B are diagrams for describing an operation in the second embodiment. A voltage applied from the terminal T1 to the free layer 10 is represented by Vfree, a voltage applied from the terminal T2 to the pin layer 18 is represented by Vpin, and a voltage applied from the terminal T3 to the piezoelectric electrode 24 is represented by Vferr. The power source voltage is represented by VDD, and a voltage for writing is represented by Vw (which is assumed to be a positive voltage, hereinafter). The state where the magnetization direction of the free layer 10 is parallel to that of the pin layer 18 is referred to as a parallel state, and the state where the magnetization direction of the free layer 10 is opposite to that of the pin layer 18 is referred to as an antiparallel state.

As illustrated in FIG. 4A, when the parallel state is rewritten to the antiparallel state, each voltage is configured as Vfree=0 V and Vpin=Vw. When Vferr=0 V, the magnetization direction of the free layer 10 is biased toward the antiparallel state by typical STT. The second embodiment configures Vferr to be equal to VDD. The voltage VDD with respect to the terminal T1 is applied to the piezoelectric electrode 24. The piezoelectric substance 22 applies a pressure in the −r direction to the magnetosnictive layer 11. When the magnetization direction is in the z direction and the magnetostrictive coefficient of the magnetostrictive layer 11 is negative, the magnetization easy plane of the magnetostrictive layer 11 becomes in the xy plane. Thus, the magnetization direction of the free layer 10 is reversed by small current, and becomes in the antiparallel state.

As illustrated in FIG. 4B, when the antiparallel state is rewritten to the parallel state, each voltage is configured as Vfree=VW and Vpin=0 V. When Vferr=0 V, the magnetization direction of the free layer 10 is biased toward the parallel state by typical STT. The second embodiment configures Vferr to be equal to VDD. The voltage VDD−Vw with respect to the terminal T1 is applied to the piezoelectric electrode 24. Here, Vw is set so that VDD−Vw>0 V. The piezoelectric substance 22 applies a pressure in the −r direction to the magnetostrictive layer 11. Since the magnetization easy plane becomes in the xy plane, the magnetization direction of the free layer 10 is reversed by small current, and becomes in the parallel state.

Figure 5A:
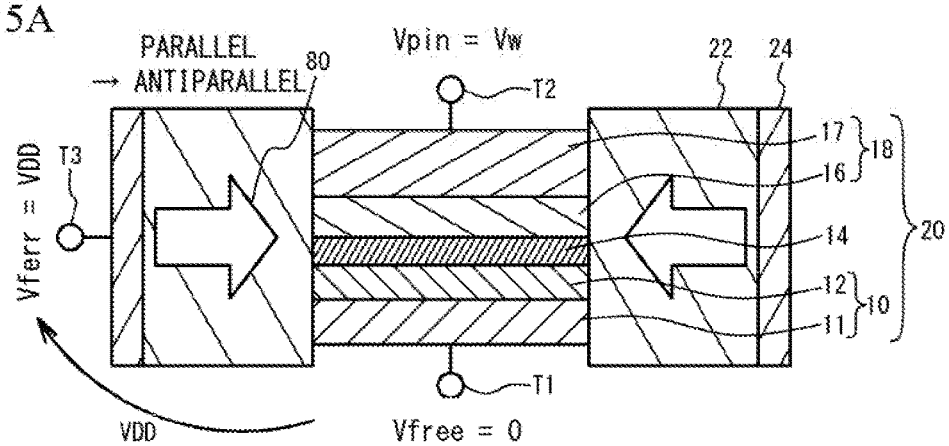
FIG. 5A and FIG. 5B are diagrams for describing another operation in the second embodiment.
Figure 5B:
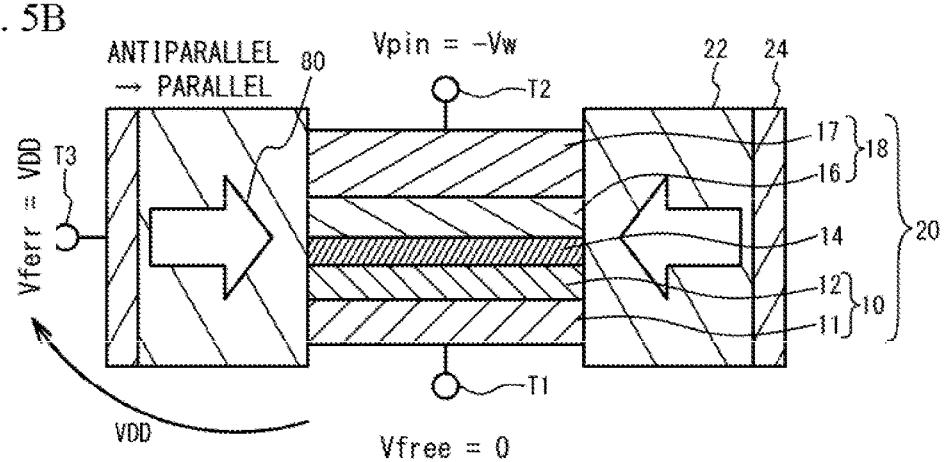

FIG. 5A and FIG. 5B are diagrams for describing another operation in the second embodiment. As illustated in FIG. 5A, the operation for rewriting the parallel state to the antiparallel state is the same as that of the FIG. 4A. As illustrated in FIG. 5B, each voltage is configured as Vfree=0 V, Vpin=−VW, and Vferr=VDD. The voltage of the free layer 10 becomes positive with respect to the pin layer 18, and Vferr becomes VDD with respect to Vfree. Thus, the antiparallel state is rewritten to the parallel state. In FIG. 5B, VDD may be less than Vw unlike FIG 4B.

In FIG. 4A through FIG. 5B when the magnetization direction of the free layer 10 is not reversed, for example, each voltage is configured as Vfree=Vpin=Vferr (for example, 0 V). This configuration allows the magnetization direction of the free layer 10 to be maintained.

In FIG. 4A through FIG. 5B, since the direction 80 of the dielectric polarization is in the −r direction, each voltage is set so that Vferr is positive with respect to Vfree when the magnetization direction is reversed. When the direction 80 of the dielectric polarization is in the +r direction, each voltage is set so that Vferr is negative with respect to Vfree when the magnetization direction is reversed. As described above, when the piezoelectric electrode 24 is located so as to surround the piezoelectric substance 22, it is only required that the piezoelectric substance 22 is dielectrically polarized in the −r direction (i.e., the direction from the piezoelectric electrode 24 to the magnetostrictive layer 11) or the +r direction (i.e., the direction from the magnetostrictive layer 11 to the piezoelectric electrode 24).

Figure 6A:
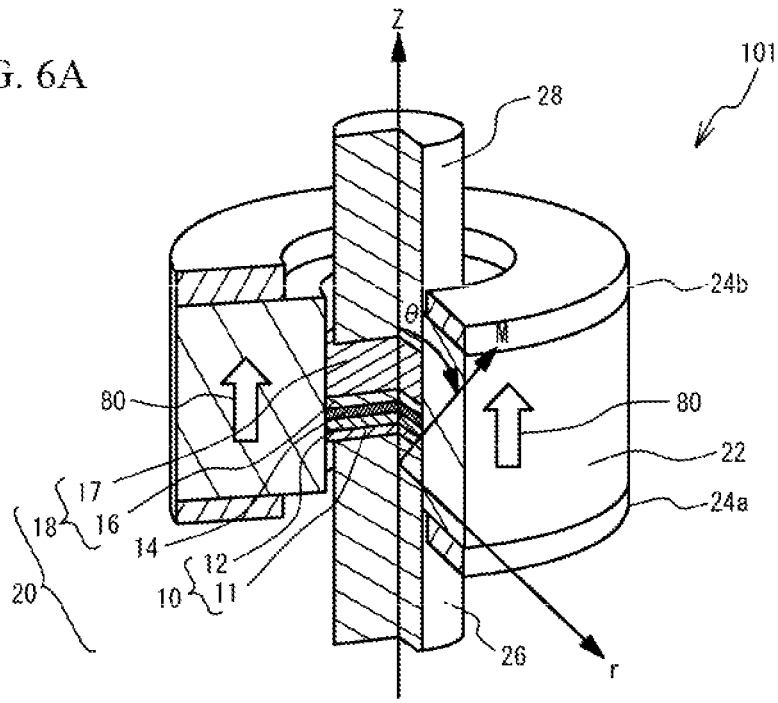
FIG. 6A is a perspective view of a nonvolatile memory element in accordance with a first variation of the second embodiment.
Figure 6B:
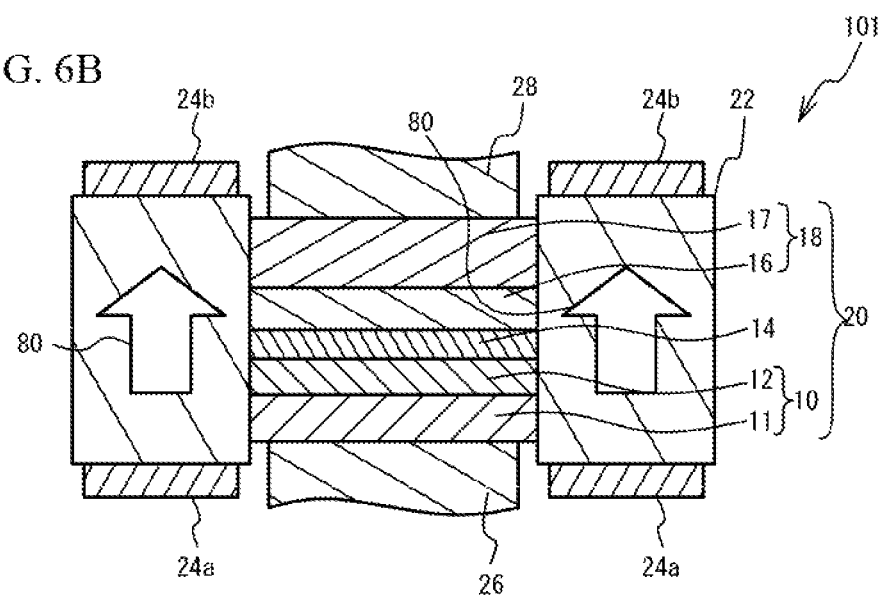
FIG. 6B is a cross-sectional view.

FIG. 6A is a perspective view of a nonvolatile memory element in accordance with a first variation of the second embodiment, and FIG. 6B is a cross-sectional view. As illustrated in FIG. 6A and FIG. 6B, in a nonvolatile memory element 101, the direction 80 of the dielectric polarization of the piezoelectric substance 22 is in the +z direction. Piezoelectric electrodes 24a and 24b are located so as to face the piezoelectric substance 22 in the z direction. The application of a positive voltage with respect to the piezoelectric electrode 24a to the piezoelectric electrode 24b allows the piezoelectric substance 22 to apply a pressure in the −r direction to the magnetostrictive layer 11. Other configurations are the same as those of the second embodiment illustrated in FIG. 4A and FIG. 4B, and the description thereof is thus omitted.

FIG. 7A and FIG. 7B are diagrams for describing an operation in the first variation of the second embodiment. A voltage applied from a terminal T3a to the piezoelectric electrode 24a is represented by Vferr2, and a voltage applied from a terminal T3b to the piezoelectric electrode 24b is represented by Vferr1. As illustrated in FIG. 7A, when the parallel state is rewritten to the antiparallel state, each voltage is configured as Vfree=0 V, Vpin=Vw, Vferr1=VDD, and Vferr2=0 V. This configuration causes the piezoelectric substance 22 to apply a pressure in the −r direction to the magnetostrictive layer 11. Thus, as in FIG. 4A, the parallel state transitions to the antiparallel state.

As illustrated in FIG. 7B, when the antiparallel state is rewritten to the parallel state, each voltage is configured as Vfree=Vw, Vpin=0 V, Vferr1=VDD, and Vferr2=0 V. This configuration causes the antiparallel state to transition to the parallel state as in FIG. 4B.

FIG. 8A and FIG. 8B are diagrams for describing another operation in the first variation of the second embodiment. As illustrated in FIG. 8A, the operation for rewriting the parallel state to the antiparallel state is the same as that of FIG. 7A. As illustrated in FIG. 8B, when the antiparallel state is rewritten to the parallel state, each voltage is configured as Vfree=Vw, Vpin=0 V, Vferr1=VDD, and Vferr2=Vw. When the voltage VW is set so that VDD−Vw>0 V, the piezoelectric substance 22 applies a pressure in the −r direction to the magnetostrictive layer 11. Thus, the antiparallel state is rewritten to the parallel state.

As illustrated in FIG. 7A through FIG. 8B, when the magnetization direction of the free layer 10 is not reversed, each voltage is configured as, for example, Vfree=Vpin=Vferr1=Vferr2 (for example, 0 V). This configuration allows the magnetization direction of the free layer 10 to be maintained.

In FIG. 7A through FIG. 8B, since the direction 80 of the dielectric polarization is in the +z direction, when the magnetization direction is reversed, each voltage is set so that Vferr1 is positive with respect to Vferr2. When the direction of the dielectric polarization is in the −z direction and the magnetization direction is reversed, each voltage is set so that Vferr1 is negative with respect to Vferr2. As described above, when a plurality of the piezoelectric electrodes 24a and 24b are provided in the z direction (in the direction in which the magnetostrictive layer 11 and the ferromagnetic layer 12 are stacked), it is only required that the piezoelectric substance 22 is dielectrically polarized in the +z direction or the z direction.

FIG. 4A through FIG. 5B and FIG. 7A through FIG. 8B describe a perpendicular magnetization type in which the magnetization directions of the free layer 10 and the pin layer 18 are in the z direction, but in the in-plane magnetization type in which the magnetization directions of the free layer 10 and the pin layer 18 are in the xy plane, the magnetostrictive coefficient of the magnetostrictive layer 11 is set negative. This setting achieves the same operation as those of FIG. 4A through FIG. 5B and FIG. 7A through FIG. 8B.

The second embodiment was simulated. The value of the bulk was used for the physical property of each material used in the simulation. The pressure applied to the magnetoresistive layer 20 by the piezoelectric substance 22 with respect to the voltage Vferr was simulated.

Figure 9A:
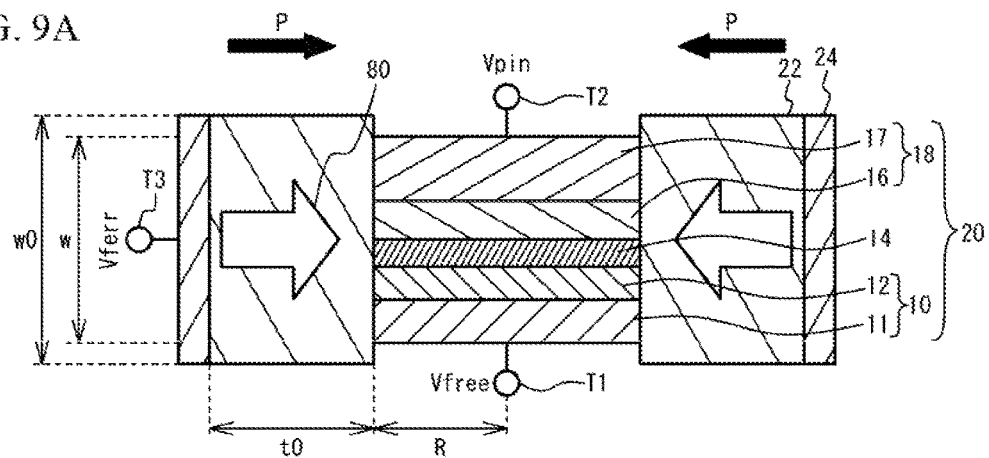
FIG. 9A is a diagram illustrating dimensions used in the simulation of the second embodiment.
Figure 9B:
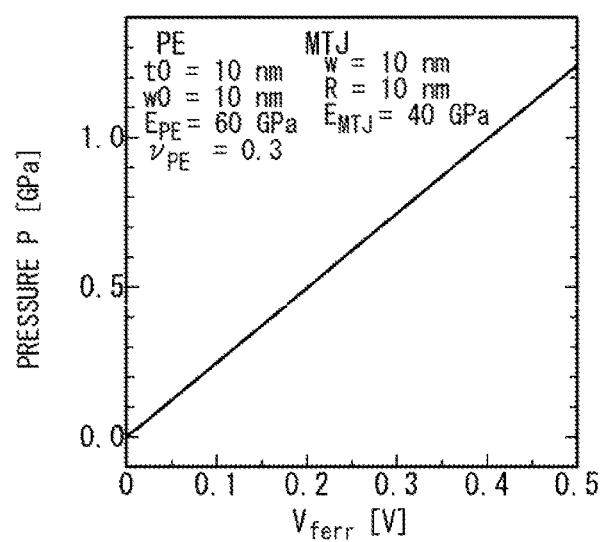
FIG. 9B is a graph of pressure versus Vferr in the second embodiment.

FIG. 9A is a diagram illustrating dimensions used in the simulation of the second embodiment, and FIG. 9B is a graph of pressure versus Vferr in the second embodiment. As illustrated in FIG. 9A and FIG. 9B, for the piezoelectric substance 22, the width t0 in the r direction was assumed to be 10 nm, the width w0 in the z direction was assumed to be 10 nm, Young's modulus $E_{PE}$ was assumed to be 60 GPa, and the Poisson ratio $v_{PE}$ was assumed to be 0.3. For the magnetoresistive layer 20, the width w in the z direction was assumed to be 10 nm, the radius R was assumed to be 10 mn, and Young's modulus $E_{MTJ}$ was assumed to be 40 GPa.

As illustrated in FIG. 9B, when Vfree=Vpin=0 V and Vferr is applied, the pressure P in the −r direction increases. When Vferr is 0.1V, the pressure P is approximately 0.2 GPa or greater. When Vferr is 0.5V, the pressure P is 1 GPa or greater.

Figure 10A:
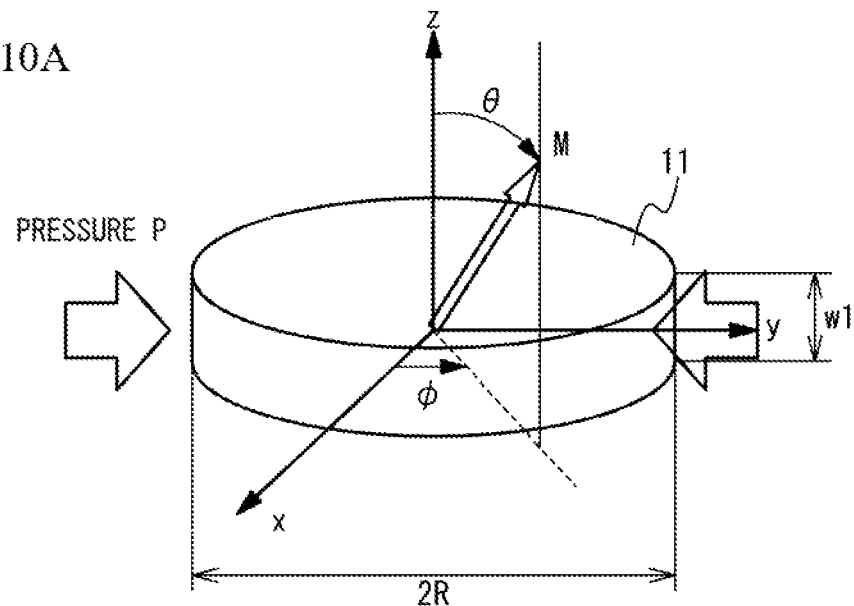
FIG. 10A is a diagram illustrating dimensions of a magnetostrictive layer used in the simulation of the second embodiment.

The angle θ dependence of the magnetization direction of the magnetization energy was then simulated under the assumption that the magnetostrictive layer 11 is formed of a SmFe$_2$ thin film that is a super magnetostrictive material. FIG. 10A is a diagram illustrating dimensions of the magnetostrictive layer used in the simulation of the second embodiment, and FIG. 10B is a graph of magnetization energy per unit volume versus the inclination angle θ of the magnetization direction in the second embodiment.

Figure 10B:
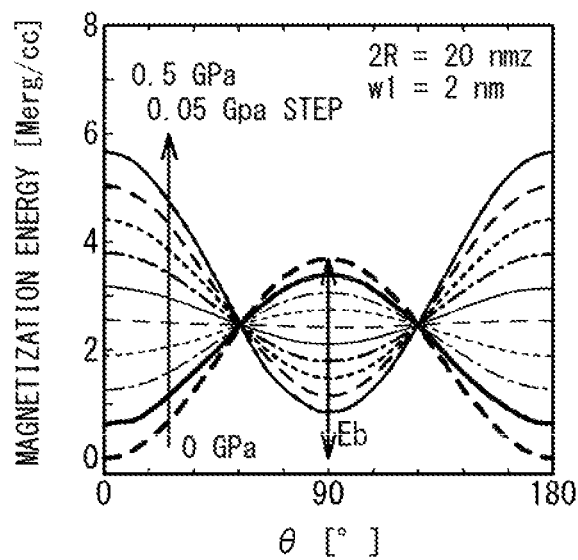
FIG. 10B is a graph of magnetization energy per unit volume versus the inclination angle θ of the magnetization direction in the second embodiment.

As illustrated in FIG. 10A and FIG. 10B, the diameter 2R of the magnetostrictive layer 11 was assumed to be 20 nm, the filum thickness w1 in the z direction was assumed to be 2 mn, and the inclination angle θ from the z-axis of the magnetization direction M was varied from 0° to 180°. The pressure P in the −r direction applied to the magnetostrictive layer 11 was varied from 0 GPa to 0.5 GPa by 0.05 GPa increments. The perpendicular magnetic anisotropy constant of SmFe$_2$ was set so that the magnetization retaining characteristic for ten years is achieved at the pressure P=0. The values of the bulk are used for the saturation magnetization and the magnetostrictive coefficient of $SmFe_2$. The magnetostrictive layer 11 was assumed to be an isotropic magnetostrictive film in which the magnetostrictive coefficient is the same in all directions.

As illustrated in FIG. 10B, when the pressure P is 0 GPa, the easy axis of the magnetic anisotropy is in the z direction. That is, when the angle θ is 0° and 180°, the magnetization energy has the local minimum, while when the angle is 90°, the magnetization energy has the local maximum. The magnetization energy difference between the local minimum and the local maximum corresponds to an energy barrier height Eb. When the pressure P is 0 GPa, the barrier height Eb is 80 $k_BT$. In the barrier height Eb, when the magnetization direction M is in the +z direction or the −z direction, the magietization direction is retained for about 10 years.

As the pressure P increases, the magnetic anisotropy energy in the xy plane increases. That is, the magnetization energy when the angle θ is 0° and 180° increases, and the magnetization energy when the angle is 90° decreases. Thus, the harrier height Eb decreases. When the pressure P is 0.2 GPa or greater, the easy plane of the magnetic anisotropy is in the xy plane. That is, when the angle θ is 0° and 180°, the magnetization energy has the local maximum, while when the angle is 90°, the magnetization energy has the local minimum. When the magnetization easy plane is in the xy plane, the reversal of the magnetization direction becomes easy. From FIG. 9B, the pressure P may be set to 0.2 GPa at Vferr=0.1 V.

Then, the magnetization reversal operation and the STT current density of the free layer in accordance with the second embodiment were simulated with use of the Landau-Lifshitz-Gilbert (LLG) equation. The simulation was conducted under the assumption that the magnetostrictive layer 11 is made of $SmFe_2$ and is a single layer.

Figure 11:
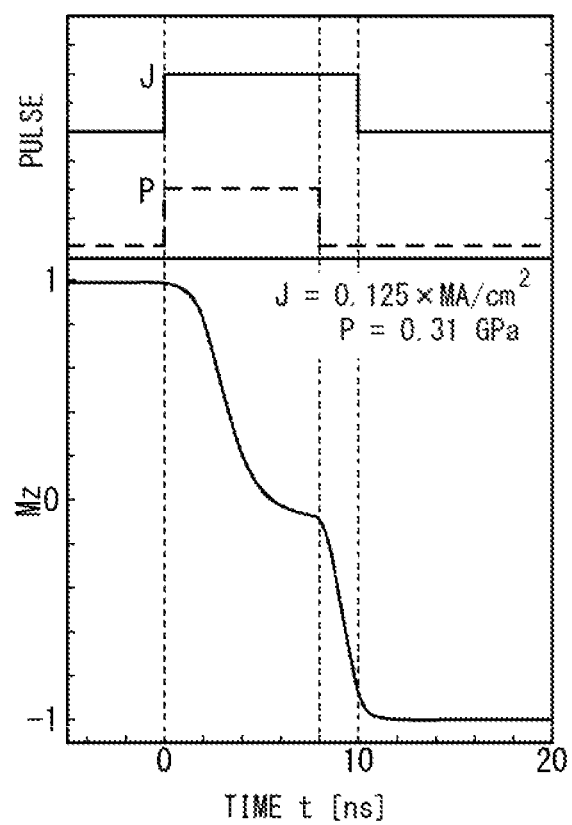
FIG. 11 is a graph of pulse waveforms of current density J and pressure P and magnetization direction Mz versus time in the second embodiment.

FIG. 11 is a graph of pulse waveforms of the current density J and the pressure P and the magnetization direction Mz versus time in the second embodiment. The application of voltages Vpin and Vfree causes the current density J to flow through the magnetoresistive layer 20 so that the magnetization direction Mz is reversed. The pressure P is a pressure applied to the magnetostrictive layer 11 in the −r direction by the piezoelectric substance 22. For the magnetization direction Mz the +z direction is represented by 1, the −z direction is represented by −1, and the r direction is represented by 0.

At time t=0, the current density J=0.125 $MA/cm^2$ and the pressure P=0.31 GPa are simultaneously applied. At time t=8 ns, the pressure P is set to 0, and at time t=10 ns, the current density J is set to 0.

When the pressure P is applied, the magnetization easy plane becomes in the xy plane, and the damping effect that biases the magnetization direction Mz toward the xy plane occurs. When the current density J is applied, the STT current causes the STT effect that the magnetization direction Mz is biased toward reversal. Because of these effects, the magnetization direction Mz becomes approximately 0 between t=0 and 8 ns. The magnetization is subject to a torque in the −z direction because of the STT effect. Thus, the magnetization direction Mz becomes stable at a side slightly negative from 0.

At time t=8 ns, when the pressure P is set to 0, the magnetization easy axis becomes in the z-axis. The damping direction is in a direction in which the magnetization direction Mz is directed in the −z direction, and the magnetization direction Mz becomes −1. As described above, the magnetization of the free layer 10 is reversed.

The threshold current density Jc with respect to the pressure P was simulated. Here, the threshold current density Jc was defined as follows. The pressure P and the current density J are applied to the magnetoresistive layer 20 of which the magnetization direction is in the +z direction to reverse the magnetization. The angle θ of the magnetization direction immediately before the pressure P and the current density J are set to 0 is represented by θ1. The angle θ1 is an angle that does not exceed the energy burner necessary for the magnetization direction to return to the +z direction even when the fluctuation due to the thermal energy $k_BT$ is applied after the pressure P is set to 0. The minimum current density J capable of achieving the angle θ1 within a pulse applying time is defined as the threshold current density Jc. The magnetization is reversed by applying a current density equal to or greater than the threshold current density Tc to the magnetoresistive layer 20 even when the magnetization direction fluctuates due to heat.

Figure 12:
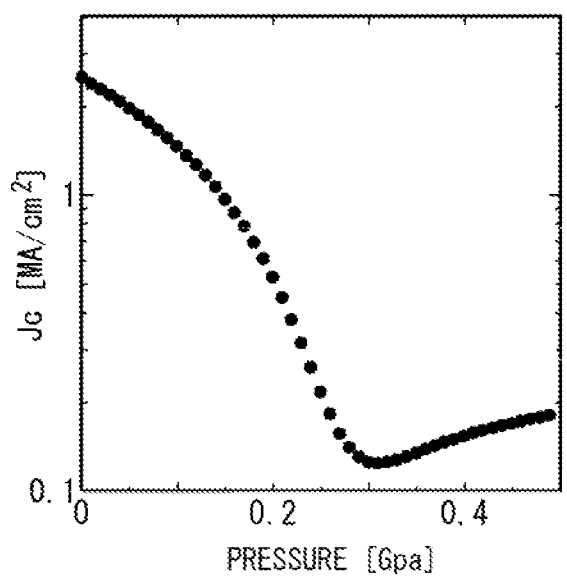
FIG. 12 is a graph of threshold current density Jc versus pressure in the second embodiment.

FIG. 12 is a graph of threshold current density Jc versus pressure in the second embodiment. The pulse width of the current density J applied to the magnetoresistive layer 20 was set to 10 ns, and the pulse width of the pressure P applied to the magnetostrictive layer 11 by the piezoelectric substance 22 was set to 8 ns. The physical property and dimensions of each material are the same as those in the simulations described above.

As the pressure P increases from 0, the threshold current density Jc decreases. When the pressure P is 0.31 GPa, the threshold current density Jc has the minimum value. The minimum threshold current density Jc is 0.125 $MA/cm^2$. This value is approximately ½0 of the value at the pressure P of 0. When the margin for the fluctuation due to heat is assumed to be small (i.e., when the angle θ1 is made to be small), the minimum value of the threshold current density Jc is further reduced. In addition, the pulse shapes and the control methods of the applied current density J and the applied pressure P are improved, the minimum threshold current density Jc is yet further reduced.

Figure 13A:
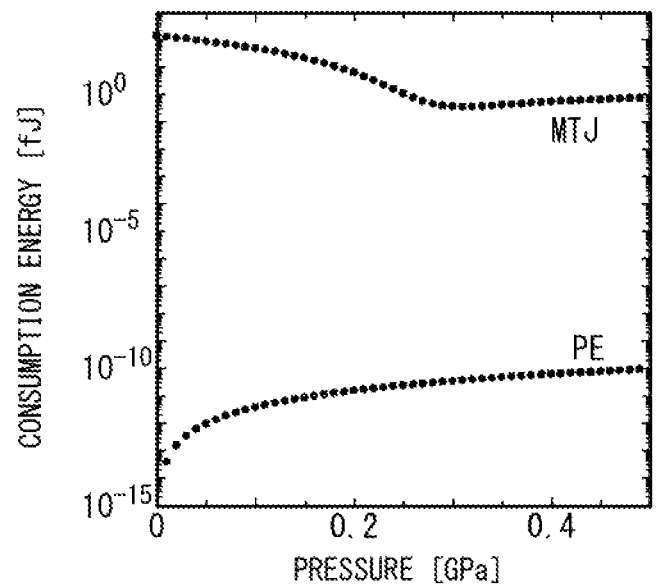
FIG. 13A is a graph of consumption energies of MTJ and PE versus pressure P in the second embodiment.
Figure 13B:
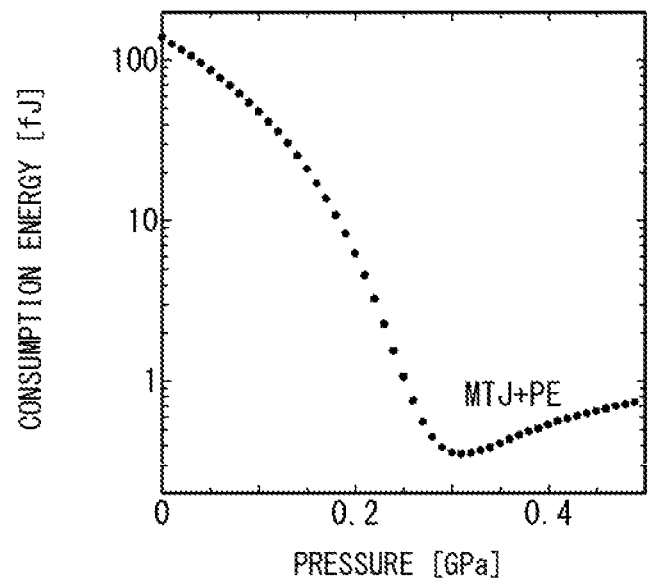
FIG. 13B is a graph of the consumption energy of MTJ+PE versus pressure P.

FIG. 13A is a graph of consumption energies of the MTJ and the PE versus pressure P in the second embodiment, and FIG. 13B is a graph of the consumption energy of MTJ+PE versus pressure P. The MTJ is the energy consumed in the magnetoresistive layer 20, and is mainly due to the applied current density J. The PE is the energy consumed in the piezoelectric substance 22, and is mainly due to the applied pressure P.

As illustrated in FIG. 13A, as the pressure increases, the consumption energy of the MTJ decreases and the consumption energy of the PE increases. The consumption energy of the PE is less than the consumption energy of the MTJ by more than ten orders, and negligible. As illustrated in FIG. 13B, the consumption energy of the whole of the nonvolatile memory element 100 (the consumption energy of MTJ+PE) is approximately equal to the consumption energy of the MTJ. The application of pressure reduces the whole consumption energy by more than two orders.

Vferr for causing the pressure to be 0.31 GPa at which the consumption energy has the minimum value is approximately 0.13 V. As described above, the application of a slight voltage to the piezoelectric electrode 24 reduces the consumption energy of the nonvolatile memory element 100. The description is given by using the second embodiment as an example, but the consumption energy is also reduced in the same manner in the first variation of the second embodiment.

In the second embodiment and the first variation thereof, the magnetostrictive layer 11 is magnetically coupled to the ferromagnetic layer 12. When the piezoelectric electrode 24 applies a voltage to the piezoelectric substance 22, the piezoelectric substance 22 applies a pressure to the magnetostrictive layer 11. Accordingly, the magnetostrictive layer 11 changes the direction of the magnetization easy axis thereof by the application of the pressure, thereby reversing the magnetization direction of the free layer 10. For example, the magnetization direction of the free layer 10 is reversed by spin-transfer-torque current-induced magnetization switching when the magnetization easy direction of the magnetostrictive layer 11 changes. Thus, the current flowing through the magnetoresistive layer 20 when the magnetization direction of the free layer 10 is changed is reduced. Therefore, the consumption energy is reduced. The magnetization direction of the free layer 10 may be changed by a method other than spin-transfer-torque current-induced magnetization switching.

In addition, the piezoelectric substance 22 is located so as to surround the magnetostrictive layer 11 from a direction intersecting with the z direction. This structure makes the piezoelectric substance 22 surround the magnetostrictive layer 11 and apply a pressure to the magnetostrictive layer 11 from the periphery. The piezoelectric substance 22 is preferably located so as to surround the magnetostrictive layer 11 from all the directions perpendicular to the z direction. The piezoelectric substance 22 may be located so as to surround the magnetostrictive layer 11 from part of the directions perpendicular to the z direction.

A case where the magnetoresistive layer 20 has a cylindrical shape and the piezoelectric substance 22 has a ring shape are described, but the shapes of the magnetoresistive layer 20 and the piezoelectric substance 22 are not limited to these shapes. For example, the magnetoresistive layer 20 may be a polygonal column such as a square pillar. Additionally, the corner of the polygonal column may be rounded. To uniformly apply a pressure to the magnetoresistive layer 20, the magnetoresistive layer 20 and the piezoelectric substance 22 are preferably rotationally symmetric with respect to the z-axis.

An air gap or an insulator may be located between each layer other than the magnetostrictive layer 11 of the magnetoresistive layer 20 and the piezoelectric substance 22. When Young's modulus of the insulator is less than that of the magnetostrictive layer 11, a pressure applied to each layer other than the magnetostrictive layer 11 from the piezoelectric substance 22 is reduced. The width in the z direction of the piezoelectric substance 22 is preferably greater than the width in the z direction of a layer to which the piezoelectric substance 22 applies a pressure. For example, when the piezoelectric substance 22 applies a pressure to all the layers of the magnetoresistive layer 20, the width w in the z direction of the piezoelectric substance 22 is greater than the width w0 in the z direction of the magnetoresistive layer 20. This structure allows a pressure to be uniformly applied to the magnetoresistive layer 20.

In the second embodiment and the first variation thereof, gaps are formed between the free layer electrode 26 and the piezoelectric substance 22 and between the pin layer electrode 28 and the piezoelectric substance 22. When the free layer electrode 26 and the pin layer electrode 28 have small Young's modulus (for example, Young's modulus less than that of the magnetoresistive layer 20), the free layer electrode 26 and the pin layer electrode 28 may be in contact with the piezoelectric substance 22.

Figure 14A:
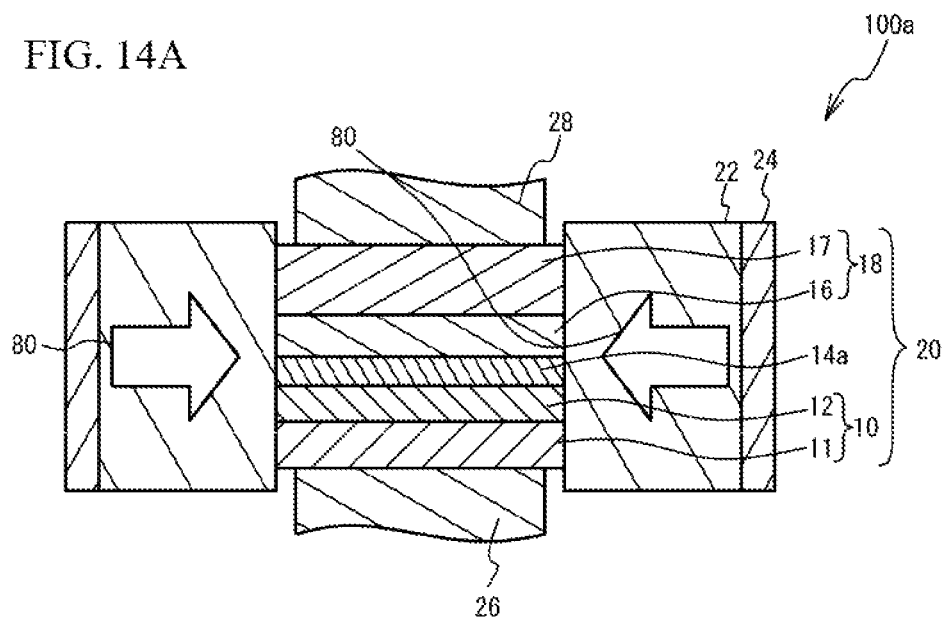
FIG. 14A and FIG. 14B are cross-sectional views of nonvolatile memory elements in accordance with a second variation of the second embodiment.
Figure 14B:
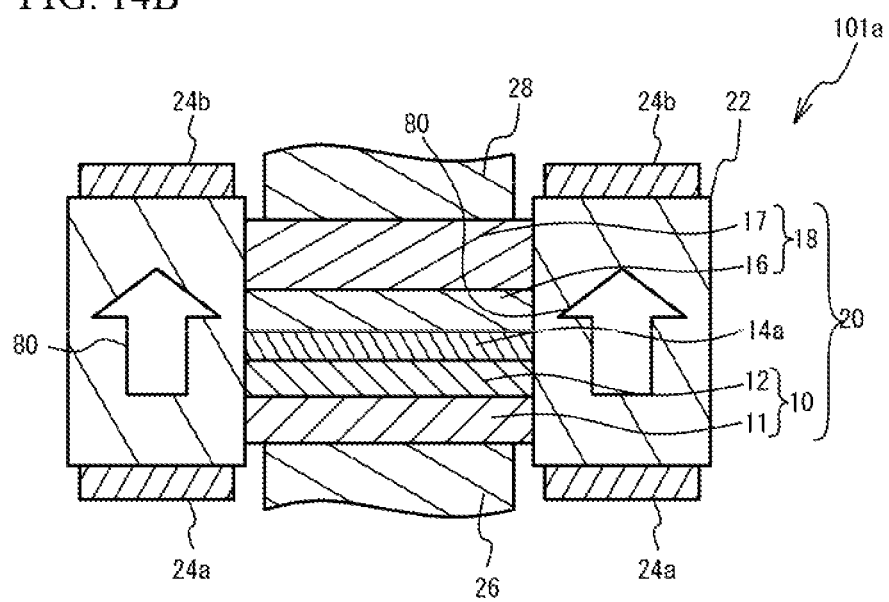
Figure 15:
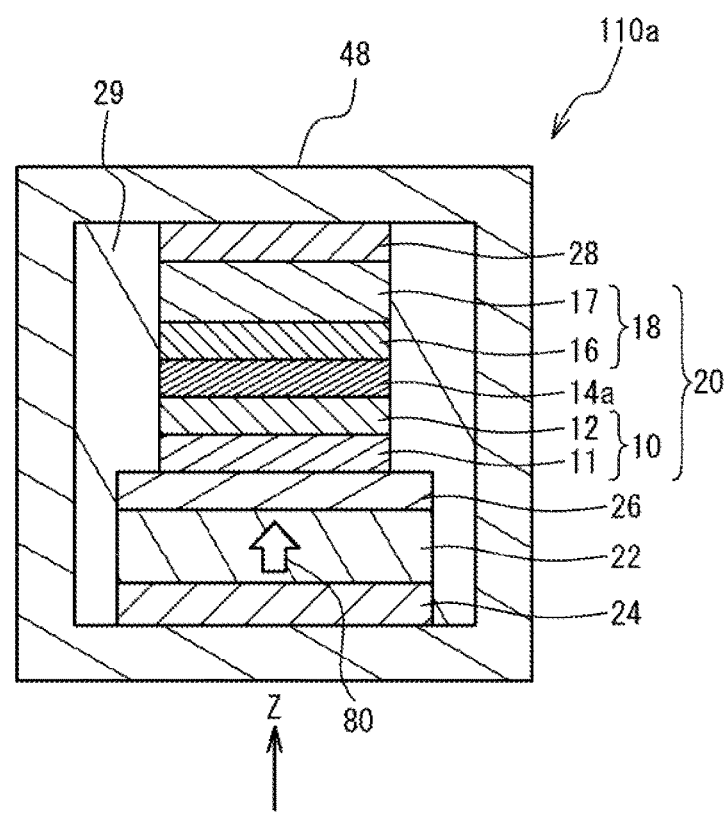
FIG. 15 is a cross-sectional view of a nonvolatile memory element in accordance with a first variation of the first embodiment.

FIG. 14A and FIG. 14B are cress-sectional views of a nonvolatile memory element in accordance with a second variation of the second embodiment. FIG. 15 is a cross-sectional view of the nonvolatile memory element in accordance with a first variation of the first embodiment. As illustrated in FIG. 14A through FIG. 15, in nonvolatile memory elements 100a, 101a, and 110a, a non-magnetic metal layer 14a as a thin film is located between the free layer 10 and the pin layer 18. The magnetoresistive layer 20 is a giant magneto resistance (GMR) element. Other structures are the same as those illustrated in FIG. 3B, FIG. 6B, and FIG. 1, and the description thereof is thus omitted. As described above, the magnetoresistive layer 20 may be a magnetic tunnel junction element or a giant magneto resistance element. In the magnetic tunnel junction element, the thin film located between the free layer 10 and the pin layer 18 is a tunnel barrier insulating layer. In the giant magneto resistance element, the thin film is a non-magnetic metal layer.

In the first and second embodiments and the variations thereof, the magnetostrictive material constituting the magnetostrictive layer 11 has the inverse magnetostrictive effect that the magnetic anisotronic energy inside the material changes when a pressure is applied. The magnetostrictive layer 11 is preferably made of a super magnetostrictive material having a magnetostrictive coefficient of which the absolute value is large. The magnetostrictive layer 11 may be made of $SmFe_2$, SmFeN, SinFeB, or $CoFe_2O_4$ as a material having a negative magnetostrictive coefficient. Terfenol-D or Gerfenol-G may be used as a material having a positive magnetostrictive coefficient. In the first embodiment, the piezoelectric substance 22 applies a pressure to the magnetostrictive layer 11 in the z direction. Thus, for the perpendicular magnetization type in which the magnetization direction of the ferromagnetic layer 12 is in the z-axis direction, the magnetostrictive coefficient is preferably positive, while for the in-plane magnetization in which the magnetization direction of the ferromagnetic layer 12 is in the xy plane, the magnetostrictive coefficient is preferably positive. In the second embodiment and the variations thereof, the piezoelectric substance 22 applies a pressure to the magnetostrictive layer 11 in the −r direction. Thus, for the perpendicular magnetization type in which the magnetization directions of the ferromagnetic layers 12 and 16 are in the z direction, the magnetostrictive coefficient is preferably negative, while for the in-plane magnetization type in which the magnetization directions of the ferromagnetic layers 12 and 16 are in the xy plane, the magnetostrictive coefficient is preferably positive.

A full Heusler alloy such as $Co_2Fe(Si, Al)$, $Co_2MnSi$, or $Co_2$ (Fe, Mn), a ferromagnetic transition metal such as Fe, Co, or CoFeB or a ferromagnetic transition metal compound are used as the ferromagnetic material constituting the ferromagnetic layers 12 and 16.

Used for the tunnel harrier layer 14 is a non-magnetic insulating film made of, for example, MgO, $AlO_x$, $TiO_x$, or the like. Used as the non-magnetic metal layer 14a is Ag, Cu, Cr or Au. The free layer electrode 26, the pin layer electrode 28, and the piezoelectric electrode 24 are made of a non-magnetic metal such as, for example, Ag, Cu, Cr or Au. The magnetostrictive layer 11 may serve for the free layer electrode 26, and the magnetization fixed layer 17 may serve for the pin layer electrode 28.

The piezoelectric substance 22 is made of a material having the inverse piezoelectric effect that the material is mechanically deformed depending on an applied voltage. An $ABC_3$ type perovskite structured material presented as follows may be used as the material for the piezoelectric substance 22.

(Ph, M1)(Ti, M2)$O_3$,
(Bi, M1)(Zn, Ti, M2)$O_3$, (Bi, M1)(Na, Ti, M2)O$_3$,
(K, M1)(Nb, M2)O$_3$,
(Li, M1)(Nb, M2)O$_3$,
(Li, M1)(Ta, M2)O$_3$.
or
(Na, M1)(Nb, M2)O$_3$
Here, M1 is Li, Ca, Ba, Sr, Bi, Pb or lanthanoid of which the valence is univalent to tervalent. M2 is Zr, Hf, Mg/Nb, Mg/Ta, In/Sc, or the like of which the valence is bivalent to sexivalent. The following material is used as a material other than the perovskite structured material.
(Hf, M3)O$_2$
Here, M3 is Sr, Si, Ba, Ca, Mg, Zr, Ce, Ti, Ge, Sn, Ta, or lanthanoid. As the material for the piezoelectric substance 22, typically used is lead zirconate titanate (PZT), strontium doping lead zirconate titanate (PSZT), magnesium niobate-lead titanate (PMT-PT), or zinc niobate-lead titanate (PZN-PT).

As the support structure 48 of the first embodiment, used is, for example, silicon nitride.

The magnetostrictive layer 11, the ferromagnetic layers 12 and 16, the tunnel barrier layer 14, the magnetization fixed layer 17, the piezoelectric substance 22, the piezoelectric electrode 24, the free layer electrode 26, and the pin layer electrode 28 are formed by, for example, sputtering or chemical vapor deposition (CVD).

The MTJ element and the GMR element, which are two-terminal elements, are described as an example of the magnetoresistive element, but it is only required that the magnetoresistive element has a free layer. For example, the free layer and the piezoelectric substance of the first and second embodiments and the variations thereof may be used for the spin transistor.

Third Embodiment

Figure 16:
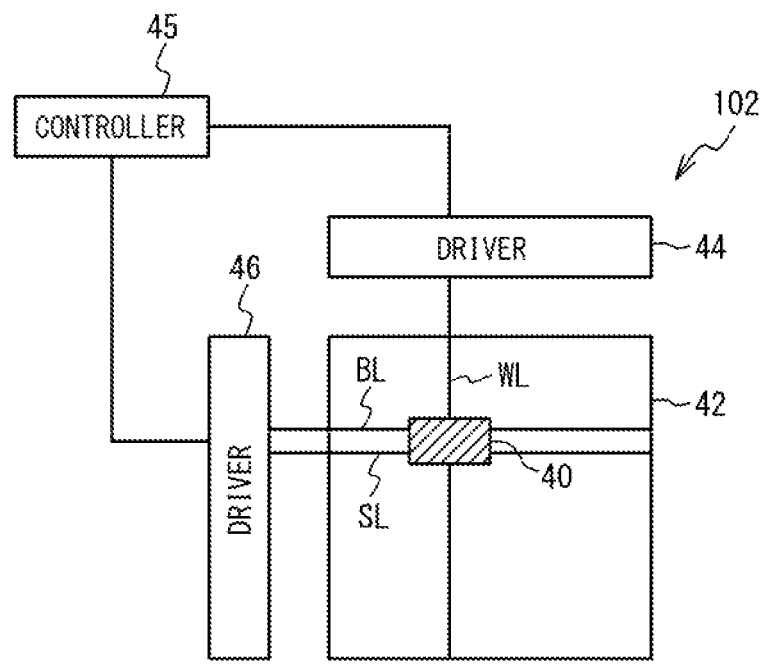
FIG. 16 is a. block diagram of an MRAM in accordance with a third embodiment.

A third embodiment is an exemplary MRAM using the nonvolatile memory element in accordance with the first and second embodiments and the variations thereof as the memory circuit. FIG. 16 is a block diagam of an MRAM in accordance with the third embodiment. As illustrated in FIG. 16, an MRAM 102 includes a memory region 42, a controller 45, and drivers 44 and 46. In the memory region 42, a plurality of memory cells 40 are arranged in matrix. The memory cells 40 arranged in the line direction are coupled to a bit line BL and a source line SL extending in the line direction. The memory cells 40 arranged in the column direction are coupled to a word line WL extending in the column direction. Although it is not illustrated, an SE line described later extends in the column direction or the line direction. The drivers 44 and 46 select a column and a line under the instruction of the controller 45, and applies a signal such as a voltage to the word line WL, the bit line BL, the source line SL, and the SE line. This operation causes one memory cell 40 to be selected. Data is read from/written in the memory cell 40 by a read circuit and a write circuit, which are not illustrated, under the instruction of the controller 45.

Figure 17A:
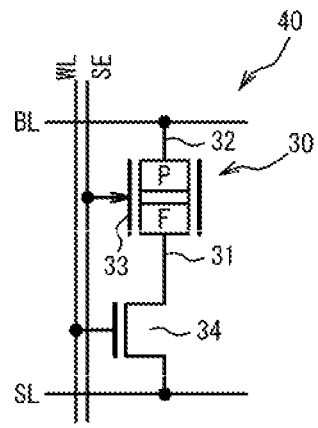
FIG. 17A through FIG. 17C are circuit diagrams of examples of a memory cell in the third embodiment.
Figure 17B:
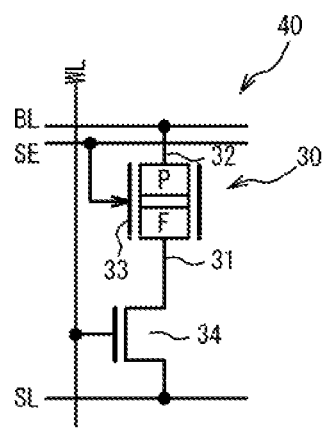
Figure 17C:
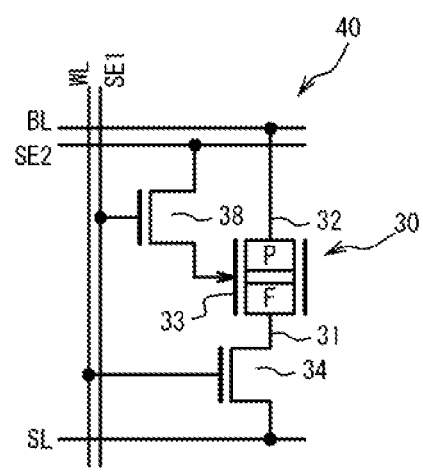

FIG. 17A through FIG. 17C are circuit diagrams illustrating examples of the memory cell in the third embodiment. F represents a free layer, while P represents a pin layer. As illustrated in FIG. 17A the memory cell 40 includes a nonvolatile memory element 30 and a field effect transistor (FET) 34. The FET 34 is an N-channel metal oxide semiconductor (MOS) FET. The nonvolatile memory element 30 is the nonvolatile memory element of the first and second embodiments. A free layer side terminal 31 coupled to the free layer corresponds to the terminal T1 in the first and second embodiments, and a pin layer side terminal 32 coupled to the pin layer corresponds to the terminal T2 in the first and second embodiments. An electrode 33 illustrated at the sides of the free layer F and the pin layer P corresponds to the piezoelectric electrode 24. The terminals T1 and T2 may be reversely coupled.

The terminal 31 of the nonvolatile memory element 30 is coupled to the drain of the FET 34. The terminal 32 is coupled to the bit line BL. The electrode 33 is coupled to the SE line. The SE line extends in parallel to the word lisle WL in the inside of the memory region 42. Write to the memory cell 40 corresponds to the magnetization reversal of the nonvolatile memory element 30. At the time of writing to the memory cell 40, the controller 45 causes the driver 46 to apply the voltage Vw to one of the bit line BL and the source line SL and 0 V to the other. The controller 45 causes the driver 44 to apply the voltage VDD to the word line WL and the SE line. This control reverses the magnetization direction of the free layer 10 in the nonvolatile memory element 30 as described in FIG. 4A and FIG. 4B, thereby causing the write to the memory cell 40. Write is possible when the controller 45 causes the drivers 44 and 46 to apply a voltage to each line as described in FIG. 5A and FIG. 5B.

As illustrated in FIG. 17B, the SE line may be parallel to the bit line BL. In this example, the driver 46 applies a voltage to the SE line. Other structures are the same as those of FIG. 17A, and the description thereof is thus omitted.

In FIG. 17A and FIG. 17B, a voltage is applied to the piezoelectric substances 22 of the memory cells 40 coupled to the SE line identical to the selected SE line. Accordingly, a pressure is applied to the magnetostrictive layers 11 of these memory cells 40. This phenomenon is referred to as a pressure disturb. The magnetic anisotropy of the free layer 10 of the memory cell 40 subject to the pressure disturb becomes in the xy plane direction. Although the current density J is not applied in this memory cell 40, the magnetization direction of the free layer 10 may become in the xy plane. Then, after the pressure P becomes 0, the magnetization direction of the free layer 10 may reverse. If it happens, erroneous write occurs.

FIG. 17C illustrates an exemplary memory cell that inhibits the pressure disturb. As illustrated in FIG. 17C, the memory cell 40 includes an FET 38. The FET 38 is au N-channel MOSFET. The source of the FET 38 is coupled to the electrode 33, the drain is coupled to an SE2 line, and the gate is coupled to an SE1 line. The SE1 line extends in parallel to the word line WL, and the SF2 line extends in parallel to the bit line BL. The drivers 44 and 46 select the SE1 line and the SE2 line of the memory cell 40 subject to write, and applies the voltage VDD thereto. Accordingly, a voltage is applied to the piezoelectric substance 22 of only the selected memory cell 40. Therefore, the pressure disturb is inhibited. Other structures are the same as those of FIG. 17A, and the description thereof is thus omitted.

Figure 18A:
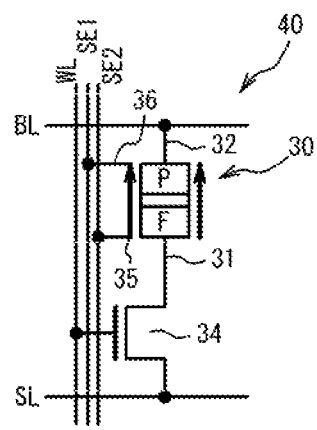
FIG. 18A through FIG. 18C are circuit diagrams of other examples of the memory cell in the third embodiment.
Figure 18B:
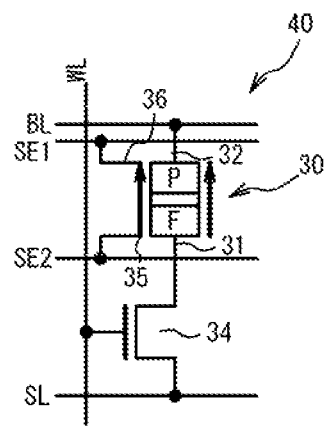
Figure 18C:
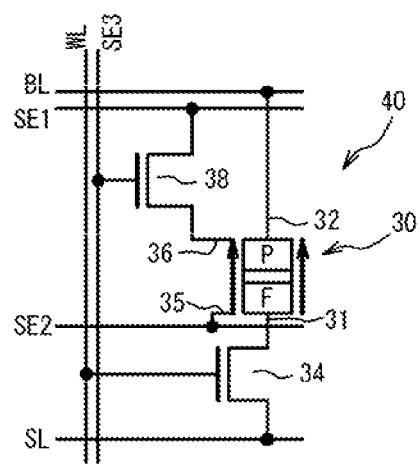

FIG. 18A through FIG. 18C are circuit diagrams illustrating other examples of the memory cell in the third embodiment. The nonvolatile memory element 30 is the nonvolatile memory element of the first variation of the second embodiment. As illustrated in FIG. 18A, the nonvolatile memory element 30 includes electrodes 35 and 36. The electrodes 35 and 36 respectively correspond to the piezoelectric electrodes 24$a$ and 24$b$ of the variation of the second embodiment. The electrodes 35 and 36 are respectively coupled to the SE2 line and the SE1 line. The SE1 line and the SE2 line extend in parallel to the word line WL. At the time of writing to the memory cell 40, the controller 45 causes the driver 46 to apply the voltage Vw to one of the bit line BL and the source line SL and 0 V to the other. The controller 45 causes the driver 44 to apply the voltage VDD to the word line WL and the SE1 line and 0 V to the SE2 line. This control reverses the magnetization direction of the free layer 10 in the nonvolatile memory element 30 as described in FIG. 7A and FIG. 7B, thereby causing the write to the memory cell 40. The write is also possible when the controller 45 causes the drivers 44 and 46 to apply a voltage to each line as described in FIG. 8A and FIG. 8B.

As illustrated in FIG. 18B, the SE1 line and the SE2 line may be parallel to the bit line BL. In this example, the driver 46 applies voltages to the SE1 line and the SE2 line. Other structures are the same as those of FIG. 18A, and the description thereof is thus omitted. The SE1 line and the SE2 line may be arranged so as to intersect with each other.

As illustrated in FIG. 18C, the source of the FET 38 is coupled to the electrode 36, the drain is coupled to the SE1 line, and the gate is coupled to an SE3 line. The SE1 line and the SE2 line extend in parallel to the bit line BL, and the SE3 line extend in parallel to the word line WL. The controller 45 causes the drivers 44 and 46 to select the SE1 line and the SE3 line of the memory cell 40 subject to write, apply the voltage VDD to the selected SE1 line and the selected SE3 line, and apply 0 V to the SE2 line. Accordingly, a voltage is applied to the piezoelectric substance 22 of only the selected memory cell 40. Therefore, the pressure disturb is inhibited. Other structures are the same as those of FIG. 18B, and the description thereof is thus omitted.

In the third embodiment, one of the free layer 10 and the pin layer 18 is coupled to the bit line BL. The FET 34 is coupled to the other of the free layer 10 and the pin layer 18. The other of the free layer 10 and the pin layer 18 is coupled to the source line SL through the FET 34. The gate of the FET 34 is coupled to the word line WL. The SE line, the SE1 line and the SE2 line, or the SE1 line through the SE3 line (control lines) are coupled to the piezoelectric electrode 24 or 24a and 24b. This structure enables to apply the nonvolatile memory element of the second embodiment and the variations thereof to the MRAM. Therefore, the consumption energy of the MRAM is reduced. It is only required that the FET 34 is a switch of which the word line WL is coupled to a control terminal.

Figure 19:
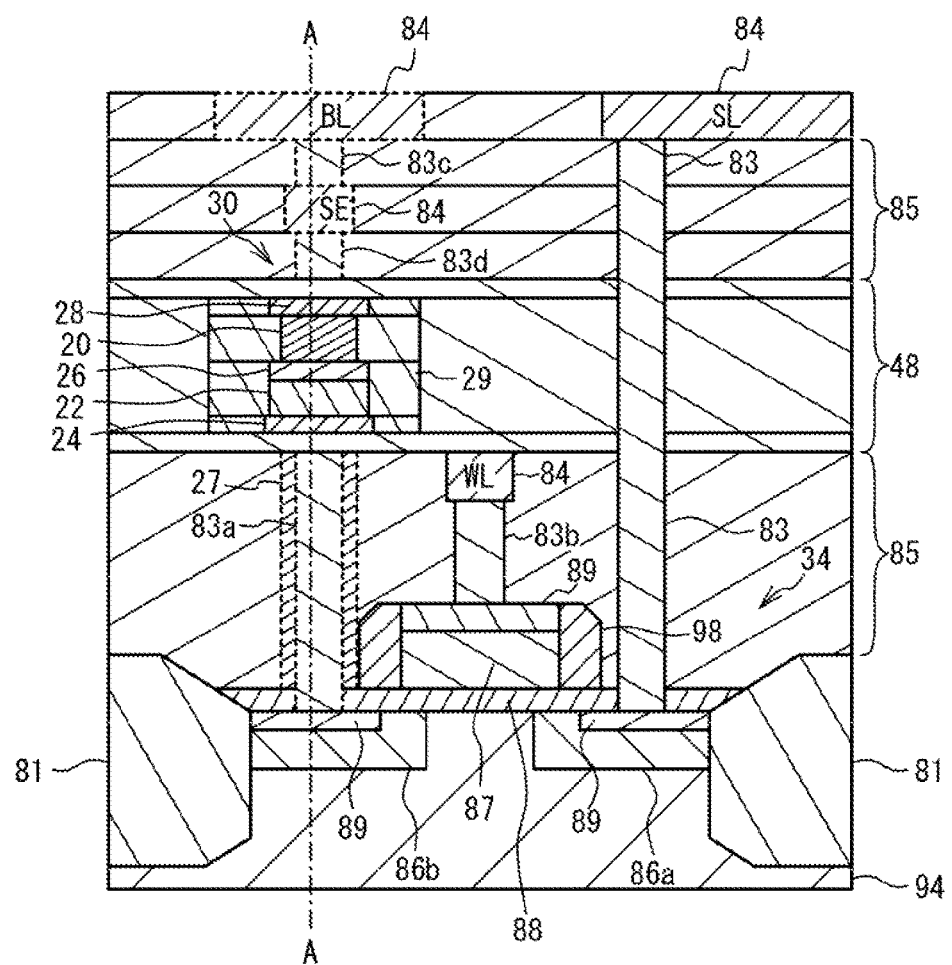
FIG. 19 is a cross-sectional view (No. 1) when the nonvolatile memory cell of the first embodiment is used for the memory cell of the third embodiment illustrated in FIG. 17A.
Figure 20:
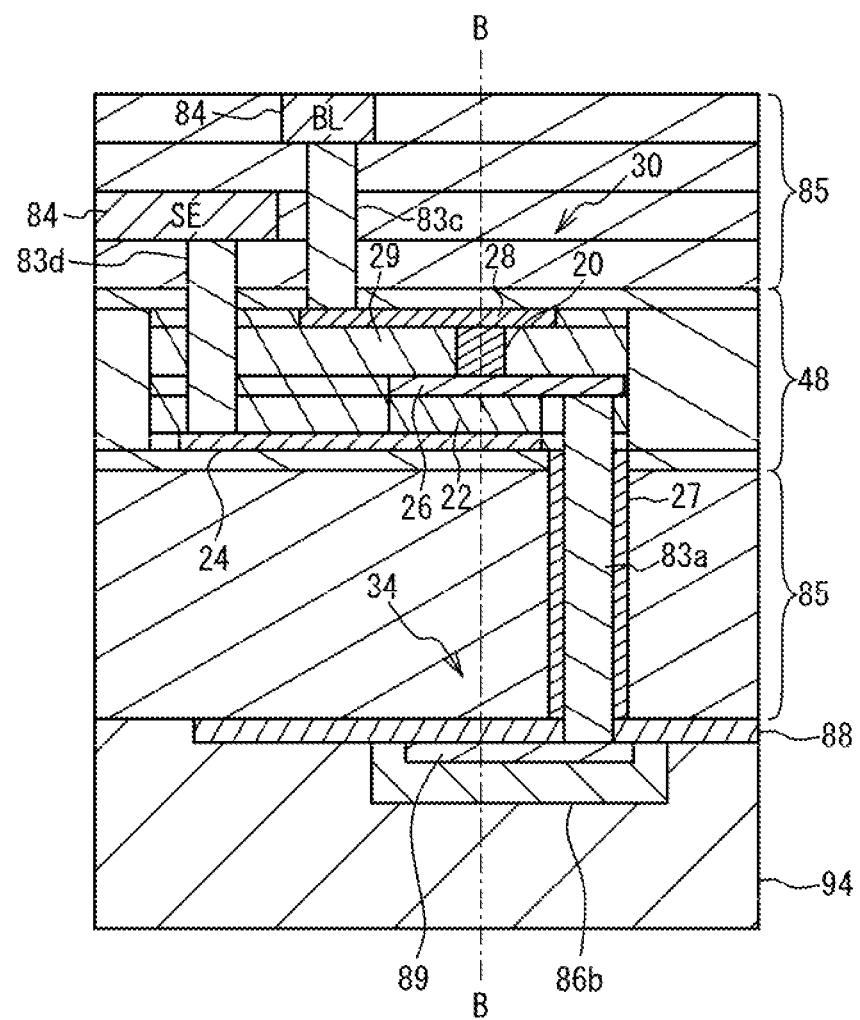
FIG. 20 is a cross-sectional view (No. 2) when the nonvolatile memory cell of the first embodiment is used for the memory cell of the third embodiment illustrated in FIG. 17A.

FIG. 19 and FIG. 20 are cross-sectional views illustrating the case where the nonvolatile memory element (magnetoresistive element) of the first embodiment is used for the memory cell illustrated in FIG. 17A of the third embodiment. FIG. 19 is a cross-sectional view taken along line B-B in FIG. 20, and FIG. 20 is a cross-sectional view taken along line A-A in FIG. 19. In FIG. 19, wiring lines corresponding to the bit line BL and the SE line and vias and a via connecting the free layer electrode 26 to the FET 38 are not present in the cross section taken along line B-B, but indicated by dashed lines.

As illustrated in FIG. 19 and FIG. 20, the nonvolatile memory element 30 is formed between interlayer insulating films 85, and the FET 34 is formed on a semiconductor substrate 94 that is a silicon substrate. The interlayer insulating films 85 are stacked on the semiconductor substrate 94. The support structure 48 is formed in the interlayer insulating film 85. The low Young modulus region 29 is formed in the support structure 48. The piezoelectric electrode 24, the piezoelectric substance 22, the free layer electrode 26, the magnetoresistive layer 20, and the pin layer electrode 28 are formed in the low Young's modulus region 29.

A shallow trench isolation (STI) oxide film 81 is formed on the semiconductor substrate 94. A source region 86a and a drain region 86b are formed in a region surrounded by the oxide film 81 in the semiconductor substrate 94. A gate electrode 87 is formed on a channel region, which is located between the source region 86a and the drain region 86b, through a gate oxide film 88. Side walls 98 of insulation are formed at both sides of the gate electrode 87. The source region 86a, the drain region 86b, and the gate electrode 87 are respectively coupled to via 83, 83a and 83b through a metal silicide film 89.

A wiring line 84 corresponding to the bit line BL is coupled to the pin layer electrode 28 through a via 83c. The wiring line 84 corresponding to the SE line is coupled to the piezoelectric electrode 24 through a via 83d. The wiring line 84 corresponding to the source line SL is coupled to the source region 86a through the via 83. The free layer electrode 26 is coupled to the drain region 86b through the via 83a.

As described above, the support structure 48 is formed in the interlayer insulating film 85, and the nonvolatile memory element 30 is located in the support structure 48. This structure integrates the FET 38 and the nonvolatile memory element 30. To efficiently apply the pressure of the piezoelectric substance 22 to the magnetostrictive layer 11, the piezoelectric electrode 24 through the pin layer electrode 28 are sandwiched between the support structures 48 and supported by the support structures 48. To efficiently apply the pressure of the piezoelectric substance 22 to the magnetostrictive layer 11, Young's modulus of the free layer electrode 26 is preferably large (for example, is greater than that of the magnetostrictive layer 11), and Young's modulus of the via 83a is preferably less than that of the free layer electrode 26. The side surface of the via 83a is preferably covered with an insulating film 27 made of a material having Young's modulus that is less than that of the via 83a. The support structure 48 may be formed only around the nonvolatile memory element 30, or may be formed across the entire face as illustrated in FIG. 19 and FIG. 20.

Figure 21:
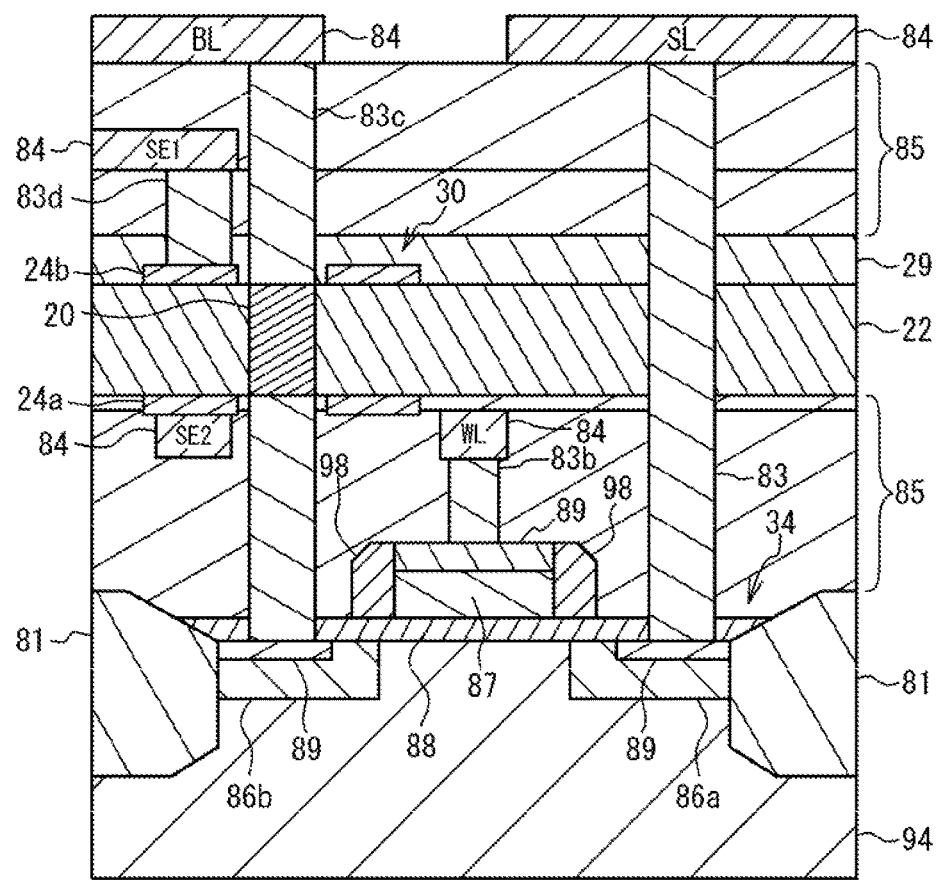
FIG. 21 is a cross-sectional view when the nonvolatile memory cell of the first variation of the second embodiment is used for the memory cell of the third embodiment illustrated in FIG. 18A.

FIG. 21 is a cross-sectional view in the case where the nonvolatile memory element of the first variation of the second embodiment is used for the memory cell illustrated in FIG. 18A of the third embodiment. As illustrated in FIG. 21, the layer of the piezoelectric substance 22 is formed in the interlayer insulating film 85. The magnetoresistive layer 20 is embedded in the piezoelectric substance 22. The piezoelectric electrodes 24b and 24a are formed on the upper and lower surfaces of the piezoelectric substance 22 so as to surround the magnetoresistive layer 20. The wiring line 84 corresponding to the SE1 line is coupled to the piezoelectric electrode 24b through the via 83d. The wiring line 84 corresponding to the SE2 line is coupled to the piezoelectric electrode 24a. The magnetoresistive layer 20 is coupled to the drain region 86b through the via 83 and the metal silicide film 89. Other structures are the same as those of FIG. 19 and FIG. 20, and the description thereof is thus omitted.

Figure 22:
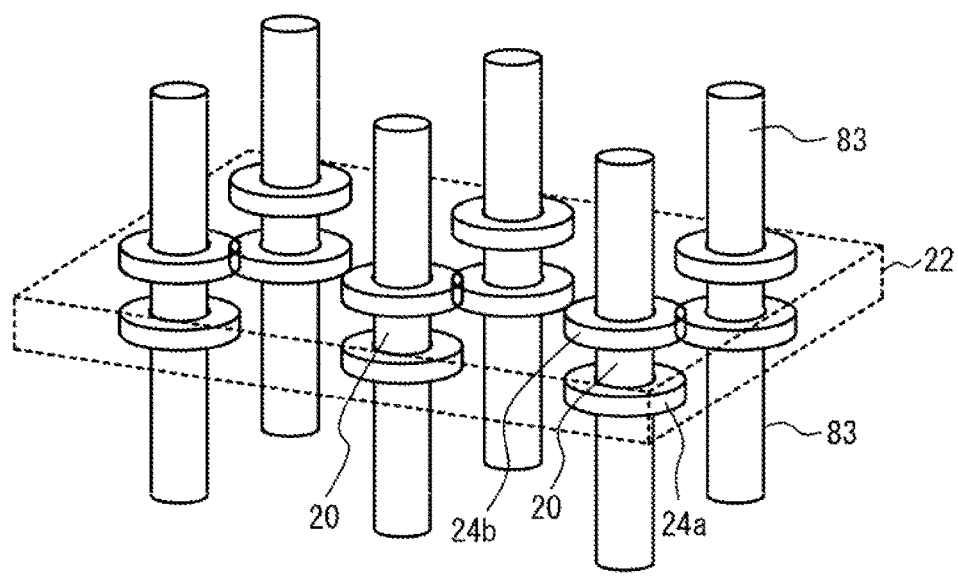
FIG. 22 is a perspective view illustrating magnetoresistive layers arranged in the piezoelectric substance.

FIG. 22 is a perspective view in which the magnetoresistive layers are arranged in the piezoelectric substance. The piezoelectric substance 22, the magnetoresistive layer 20, the piezoelectric electrodes 24a and 24b, and the via 83 are illustrated. As illustrated in FIG. 22, the magnetoresistive layers 20 may be arranged in the sheet-like piezoelectric substance 22. This structure enables to efficiently integrate the memory cells 40.

As described above, when the piezoelectric substance 22 is formed in a sheet-like shape in the interlayer insulating film 85, the FET 38 and the nonvolatile memory element 30 are integrated. The low Young's modulus region 29 for reducing the pressure is preferably located above or below the piezoelectric substance 22. The piezoelectric substance 22 may be formed only around the nonvolatile memory element 30, or may be formed across the entire face as illustrated in FIG. 21.

The memory cell 40 of the third embodiment is able to be formed by using the nonvolatile memory element of other than the first embodiment and the first variation of the second embodiment.

Fourth Embodiment

Figure 23:
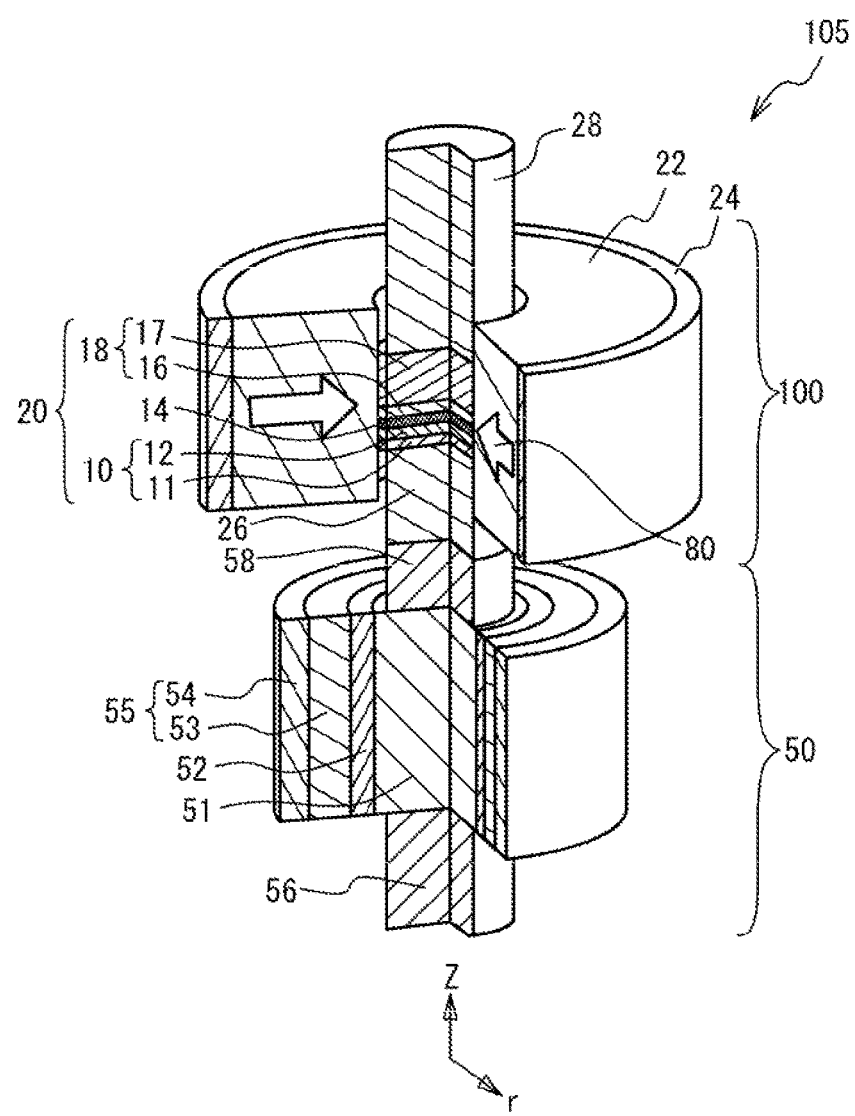
FIG. 23 is a perspective view of an electronic device in accordance with a fourth embodiment.

A forth embodiment is an exemplary electronic device using the nonvolatile memory element of the first and second embodiments and the variations thereof and a wire FET. FIG. 23 is a perspective view of an electronic device in accordance with the fourth embodiment. As illustrated in FIG. 23, in an electronic device 105, a wire FET 50 is coupled to the nonvolatile memory element 100 in accordance with the second embodiment. The wire FET 50 includes a channel 51, a gate insulating film 52, a gate 55, a source 56, and a drain 58. The channel 51 is made of a semiconductor such as silicon. The gate insulating film 52 is an insulating film made of silicon oxide or the like. The gate 55 includes a polysilicon layer 53 and a metal layer 54. The source 55 and the drain 58 are metal layers.

The channel 51, the source 56, and the drain 58 have cylindrical shapes. The drain 58 is coupled to the free layer 10. The channel 51 is located between the source 56 and the drain 58. The gate insulating film 52 is located so as to surround the channel 51. The gate 55 is located so as to surround the gate insulating film 52. The structure of a transistor such as the FET using a nanowire as the channel 51 is similar to that of the nonvolatile memory element 100. For example, the source 56, the channel 51, and the drain 58 are stacked in the direction in which the free layer 10, the tunnel barrier layer 14, and the pin layer 18 are stacked (the z direction). The gate 55 surrounds a part of the channel 51 from the direction intersecting with the z direction (for example, the −r direction). Thus, the occupancy area is reduced by stacking the nonvolatile memory element 100 and the wire FET 50. It is only required that one of the source 56 and the drain 58 is coupled to one of the free layer 10 and the pin layer 18. The nonvolatile memory element 100 may be the nonvolatile memory element 101 of the first and second variations of the second embodiment.

Figure 24:
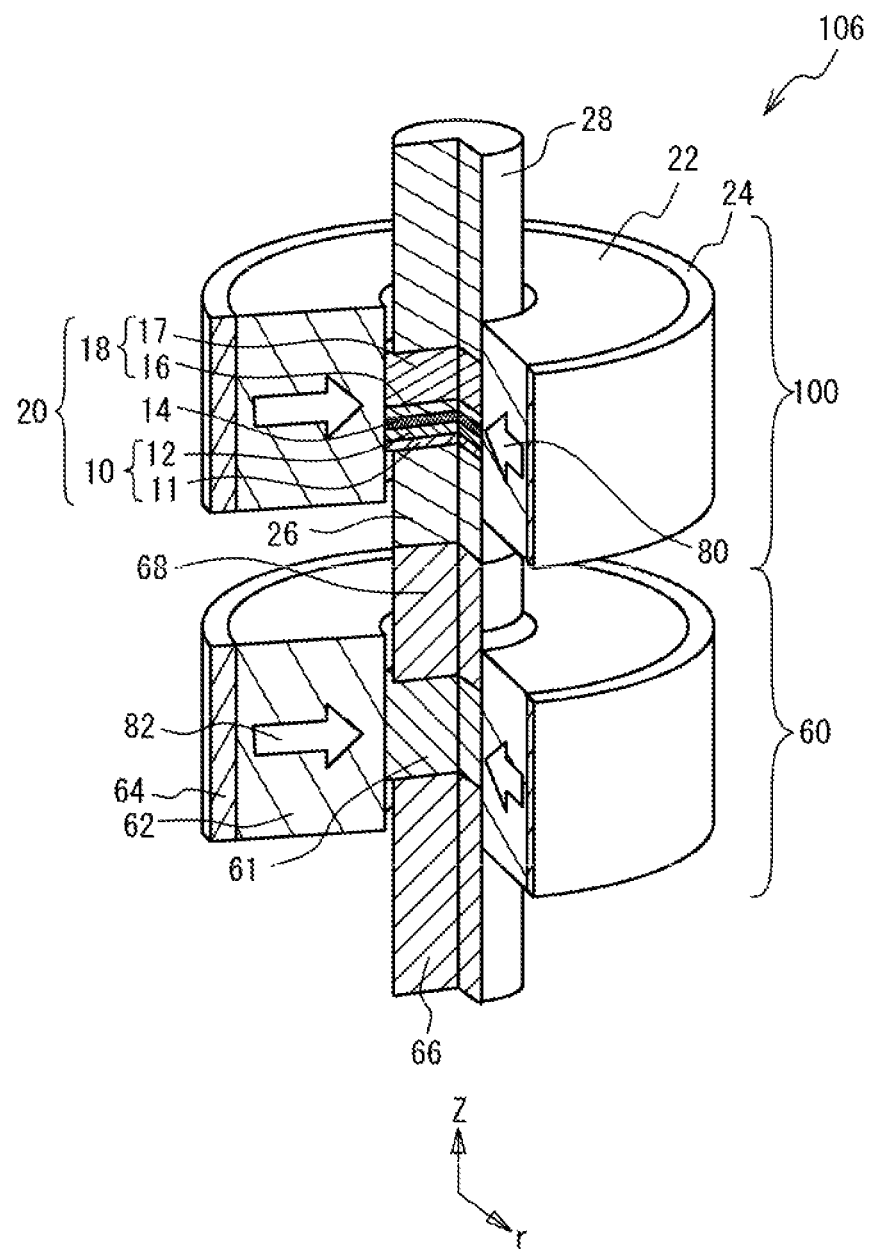
FIG. 24 is a perspective view of an electronic device in accordance with a first variation of the fourth embodiment.

A first variation of the fourth embodiment uses a piezoelectric transistor (PET) instead of the wire FET. The PET is a transistor including a piezoelectric substance having a large piezoelectric effect and a piezoresistor having a piezo resistance effect that causes metal-insulator transition by pressure. FIG. 24 is a perspective view of an electronic device in accordance with the first variation of the fourth embodiment. As illustrated in FIG. 24, in an electronic device 106, a PET 60 includes a piezoresistor 61, a piezoelectric substance 62, a gate electrode 64, a source 66, and a drain 68. The piezoresistor 61, the source 66, and the drain 68 have cylindrical shapes. The gate includes the piezoelectric substance 62 and the gate electrode 64. The piezoelectric substance 62 surrounds the piezoresistor 61. A direction 82 of the dielectric polarization of the piezoelectric substance 62 is in the −r direction. The gate electrode 64 surrounds the, piezoelectric substance 62. The source 66 and the drain 68 are located at both sides of the piezoresistor 61 in the z direction. The gate includes the piezoelectric substance 62 that applies a pressure to the piezoresistor 61 from the −r direction.

In the PET 60, when a positive voltage with respect to the source 66 is applied to the gate electrode 64, the piezoelectric substance 62 applies a pressure in the −r direction to the piezoresistor 61. This causes the piezoresistor 61 to transition to a metallic phase. Thus, carriers conduct from the source 66 to the drain 68. When no voltage is applied between the gate electrode 64 and the source 66, no pressure is applied to the piezoresistor 61, and the piezoresistor 61 becomes in an insulator phase. Accordingly the conduction of carriers from the source 66 to the drain 68 is blocked. Since the piezoelectric substance 52 surrounds the piezoresistor 61 from the −r direction, the piezoelectric substance 62 efficiently applies a pressure to the piezoresistor 61. In the piezoresistor 61, since the metallic phase and the insulator phase are switched, a large on/off current ratio is obtained.

The PET 60 has a structure similar to that of the nonvolatile memory element 100. Thus, the occupancy area is reduced by stacking the nonvolatile memory element 100 and the PET 60. It is only required that one of the source 66 and the drain 68 is coupled to one of the free layer 10 and the pin layer 18. The nonvolatile memory element 100 may be the nonvolatile memory element of the first and second variations of the second embodiment. The direction 82 of the dielectric polarization of the piezoelectric substance 62 of the PET 60 may be in the +r direction. The direction of the dielectric polarization of the piezoelectric substance 62 may be in the +z direction or the −z direction. In this case, the gates are located at the both sides of the piezoelectric substance 62 in the z direction. As the material for the piezoresistor 61, used is, for example, SmSe, TmSe, SmS, $Ca_2RuO_4$, $(Ca, Ba, SrRu)O_3$, $Ni(S_xSe_{1-x})_2C$, or $(V_{1-x}Cr_x)_2O_3$. The material that is the same as the material for the piezoelectric substance 22 is used as the material for the piezoelectric substance 62.

Fifth Embodiment

Figure 25:
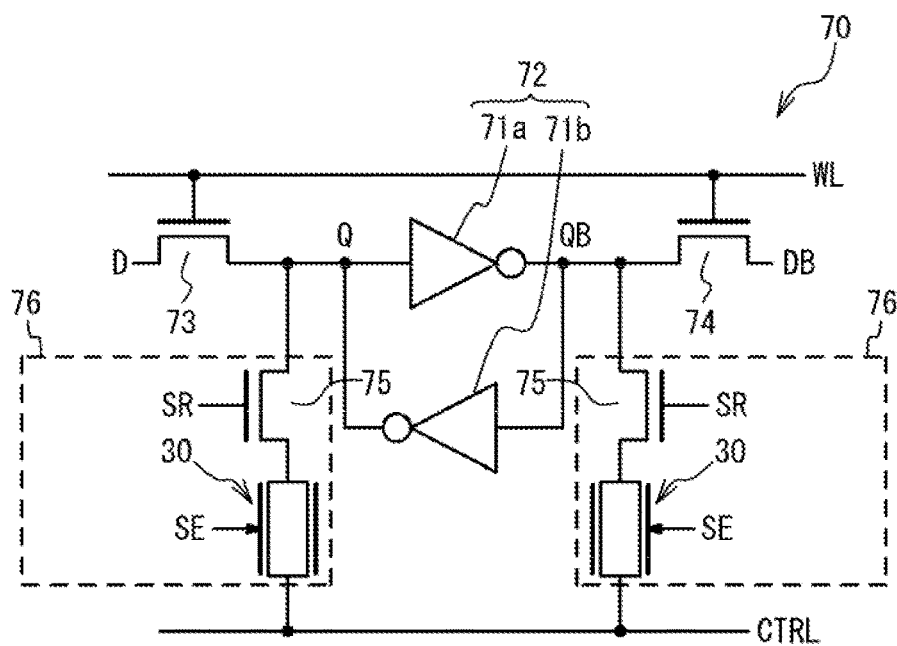
FIG. 25 is a circuit diagram of a memory cell of a nonvolatile SRAM in accordance with a fifth embodiment.

A fifth embodiment uses the nonvolatile memory element of the first and second embodiments and the variations thereof for a nonvolatile bistable circuit. FIG. 25 is a circuit diagram of a memory cell using a nonvolatile static RAM (nonvolatile SRAM) in accordance with the fifth embodiment. As illustrated in FIG. 25, a memory cell 70 of the nonvolatile SRAM includes a bistable circuit 72 and the nonvolatile memory element 30. The nonvolatile memory element 30 is the nonvolatile memory element of the first and second embodiments and the variations thereof. The bistable circuit 72 stores data in a volatile manner. The nonvolatile memory element 30 stores data stored in the bistable circuit 72 in a non-volatile manner (i.e., stores data in the nonvolatile memory element 30 and retains data in the nonvolatile memory element 30 in a non-volatile manner), and restores the data stored in a non-volatile manner in the bistable circuit 72.

The bistable circuit 72 includes inverters 71a and 71b connected in a loop shape and memory nodes Q and QB that are located on the loop and complementary to each other. Although the illustration is omitted, the bistable circuit 72 is connected between the power source and a ground. A power switch made of a transistor may be located between the bistable circuit 72 and the power source, between the bistable circuit 72 and a ground, or both between the bistable circuit and the power source and between the bistable circuit 72 and a ground. The memory nodes Q and QB are respectively coupled to the input-output lines D and DB through FETs 73 and 74. The gates of the FETs 73 and 74 are coupled to the word line WL. Write and read of data to and from the bistable circuit 72 is performed by turning off the FET 75 in the same way as in a typical SRAM.

The FET 75 and the nonvolatile memory element 30 are connected in series in a pathway 76 between the memory nodes Q and QB and a control line CTRL. One of the source and the drain of the FET 75 is coupled to the memory nodes Q and QB, and the other of the source and the drain is coupled to the nonvolatile memory element 30. The gate of the FET 75 is coupled to a switch line SR.

The operation for storing data from the bistable circuit 72 to the nonvolatile memory element 30 is performed by setting the store enable (SE) level at a high level and setting the control line CTRL at a high level and a low level while the FET 75 is being turned on. After data is stored in the nonvolatile memory element 30, the power source supplied to the memory cell 70 is shut off. Since the first and second embodiments and the variations thereof are used as the nonvolatile memory element 30 the consumption energy necessary for a restoring operation is reduced compared to the consumption energy when a typical magnetoresistive element is used.

The operation for restoring data from the nonvolatile memory element 30 to the bistable circuit 72 is performed by turning on the FET 75 and supplying an electric power to the bistable circuit 72 while the control line CTRL is at a low level.

Figure 26:
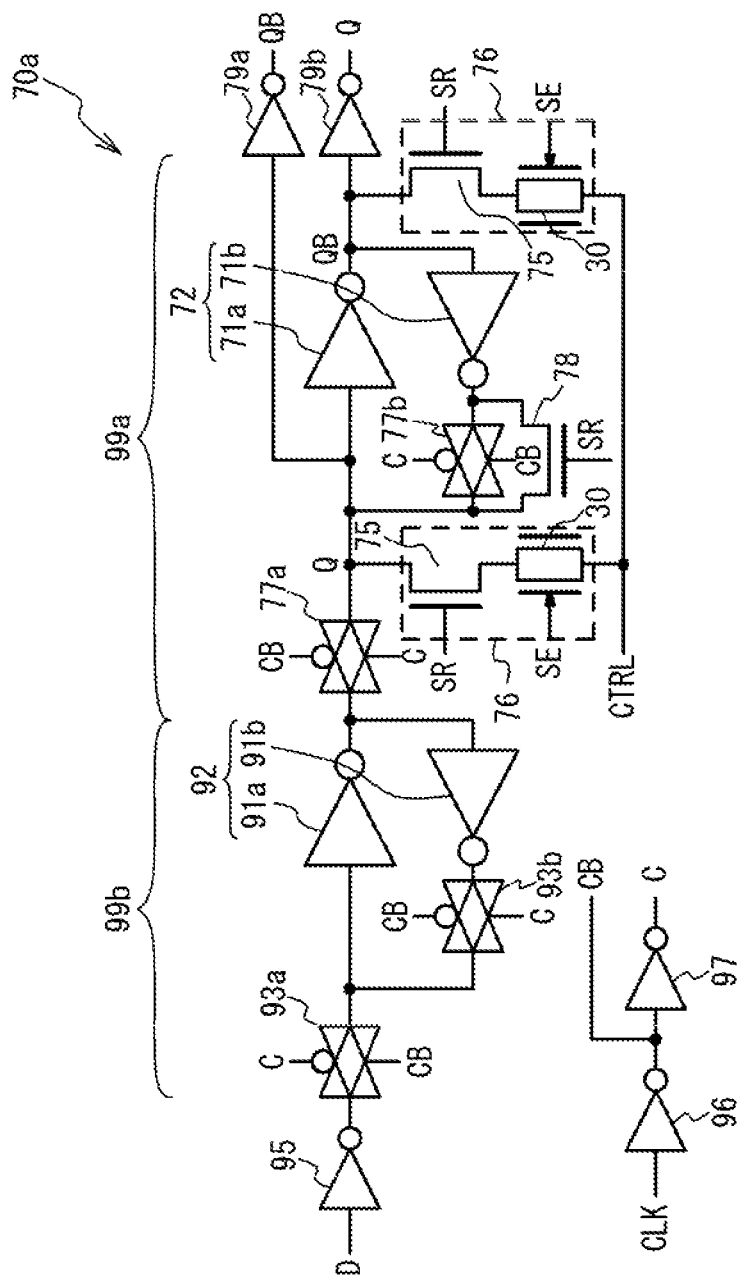
FIG. 26 is a circuit diagram of a nonvolatile flip-flop circuit in accordance with a first variation of the fifth embodiment.

A first variation of the fifth embodiment uses the first and second embodiments and the variations thereof for a nonvolatile master-slave flip-flop circuit. FIG. 26 is a circuit diagram of a nonvolatile flip-flop circuit in accordance with the first variation of the fifth embodiment. As illustrated in FIG. 26, a nonvolatile flip-flop circuit 70a includes a D-latch circuit 99a and a D-latch circuit 99b. The D-latch circuit 99a includes the bistable circuit 72, pass gates 77a and 77b, the nonvolatile memory element 30, and FETs 75 and 78. The pass gate 77b and the FET 78 are connected in parallel in the loop of the bistable circuit 72. The FET 75 and the nonvolatile memory element 30 are connected in series between the memory nodes Q and QB in the bistable circuit 72 and the control line CTRL. The voltage of the memory node Q becomes a QB signal through an inverter 79a. The voltage of the memory node QB becomes a Q signal through an inverter 79b. The memory node Q is coupled to the D-latch circuit 99b through the pass gate 77a.

The D-latch circuit 99b includes a bistable circuit 92, and pass gates 93a and 93b. In the bistable circuit 92, inverters 91a and 91b are connected in a loop shape. The pass gate 93b is connected in the loop of the bistable circuit 92. Data D is input to the bistable circuit 92 through an inverter 95 and the pass gate 93a. A clock signal CLK becomes a clock CB through an inverter 96, and further becomes a clock C through an inverter 97. The clocks CB and C are input to each of the pass gates 77a, 77b, 93a, and 93b.

The nonvolatile SRAM cell of the fifth embodiment and the nonvolatile flip-flop circuit of the first variation of the fifth embodiment are able to be used for, for example, a register or a cash memory. As described above, the nonvolatile memory elements of the first and second embodiments and the variations thereof are able to be used for a nonvolatile power gating system including a nonvolatile bistable circuit. This configuration reduces the consumption energy at the time of nonvolatile writing. Thus, break-even time (see Patent Document 1) is reduced, and the nonvolatile power gating with high energy efficiency becomes possible.

In the pathway 76 of the fifth embodiment and the variation thereof, the connection relation between the nonvolatile memory element 30 and the FET 75 may be opposite. The FET 75 may be omitted, and only the nonvolatile memory element 30 may be coupled. Furthermore, the number of the nonvolatile memory element 30 may be one, and the nonvolatile memory element 30 may be connected between the one memory node Q or QB of the bistable circuit 72 and the control line CTRL. The nonvolatile memory element 30 and the FET 75 are respectively the nonvolatile memory element 30 and the wire FET 50 of the fourth embodiment, or the nonvolatile memory element 30 and the PET 60 of the variation of the fourth embodiment.

Sixth Embodiment

Figure 27A:
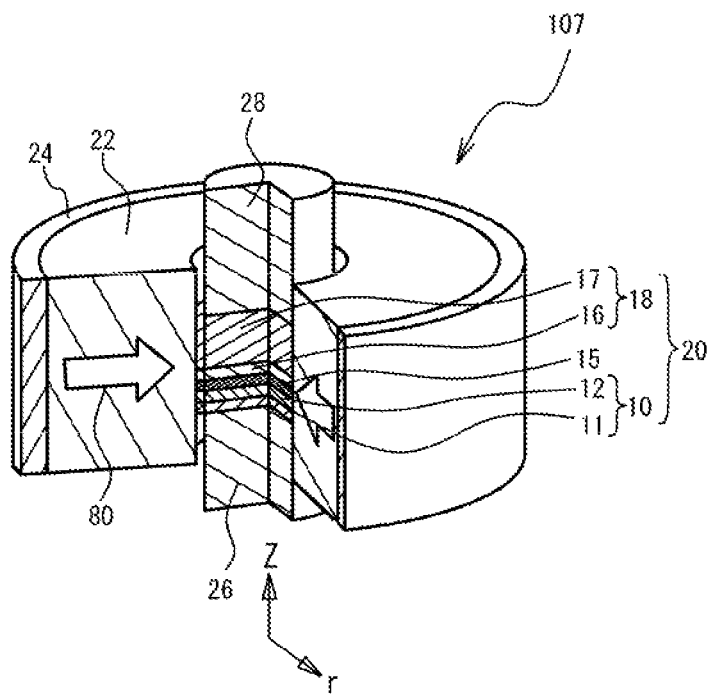
FIG. 27A is a perspective view of a nonvolatile memory element in accordance with a sixth embodiment.
Figure 27B:
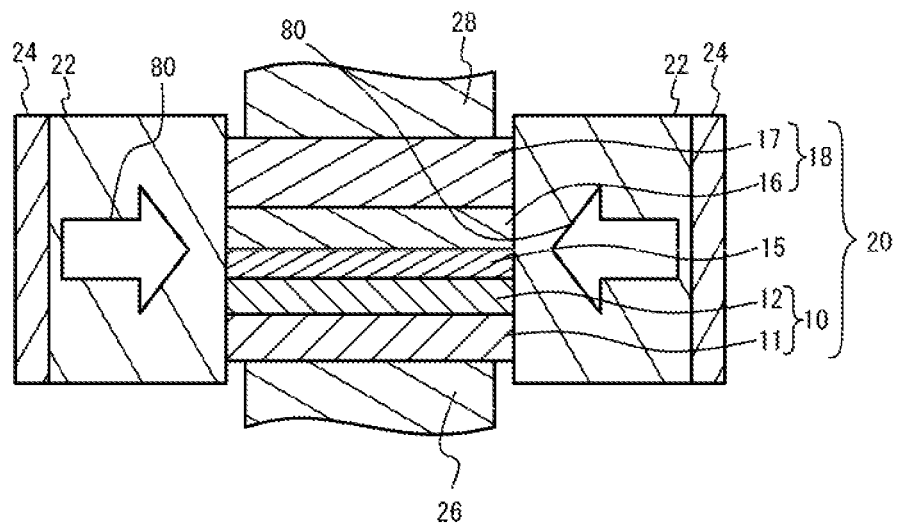
FIG. 27B is a cross-sectional view.

A sixth embodiment uses a piezoresistor for a thin film between the free layer and the pin layer. FIG. 27A is a perspective view of an electronic device in accordance with the sixth embodiment, and FIG. 27B is a cross-sectional view. As illustrated in FIG. 27A and FIG. 27B, in a nonvolatile memory element 107, the thin film between the free layer 10 and the pin layer 18 is a piezoresistor 15. The piezoelectric substance 22 is dielectrically polarized in the −r direction. When the piezoelectric electrode 24 is at 0 V, the piezoelectric substance 22 does not apply a pressure to the piezoresistor 15, and the piezoresistor 15 is in an insulator phase. When the piezoelectric electrode 24 is at a positive voltage, the piezoelectric substance 22 applies a pressure in the −r direction to the piezoresistor 15, and the piezoresistor 15 becomes in a metallic phase. The inverse magnetostrictive effect of the magnetostrictive layer 11 is also expected. When no voltage is applied to the piezoelectric electrode 24, the magnetoresistive layer 20 becomes of a GMR type. When a positive voltage is applied to the piezoelectric electrode 24, the magnetoresistive layer 20 becomes of a MTJ type.

In the sixth embodiment, the thin film between the free layer 10 and the pin layer 18 includes the piezoresistor 15. The piezoelectric substance 22 applies a pressure to the piezoresistor 15. Thus, when a positive voltage is applied to the piezoelectric electrode 24, the resistance of the magnetoresistive layer 20 becomes low, and the current density is secured even when the voltage between the free layer electrode 26 and the pin layer electrode 28 is very low voltage. Furthermore, the current density is reduced by the inverse magnetostrictive effect. When no voltage is applied to the piezoelectric electrode 24, larger resistance change is expected because of the tunnel magnetoresistance effect.

When the nonvolatile memory element 107 is applied to, for example, the MRAM of the third embodiment, the consumption energy is reduced because rewrite is possible with low current density when a positive voltage is applied. When no voltage is applied, the resistance change is large. Thus, read becomes easy. Alternatively, the nonvolatile memory element 107 may be used for the memory circuits of the fifth embodiment and the variation thereof.

A first variation of the sixth embodiment applies the nonvolatile memory element 107 to the MRAM. The film thickness of the piezoresistor 15 is configured to be large to the extent that a tunneling conduction does not occur. The nonvolatile memory element 107 is considered as a transistor using the piezoresistor 15 for the channel. In this case, the nonvolatile memory element 107 serves the functions of both a transistor and a two-terminal magnetoresistive element.

Figure 28:
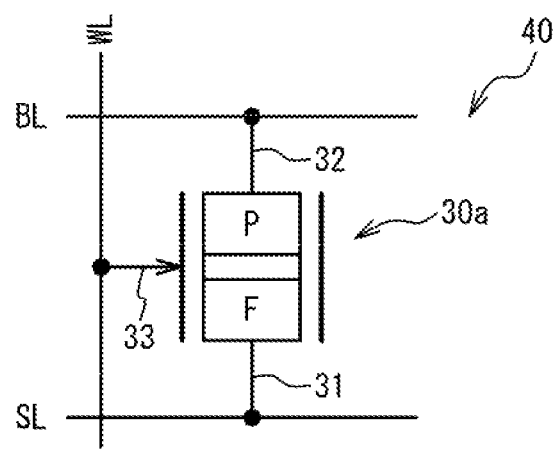
FIG. 28 is a circuit diagram of a memory cell in accordance with a first variation of the sixth embodiment.

FIG. 28 is a circuit diagram of a memory cell in accordance with the first variation of the sixth embodiment. As illustrated in FIG. 28, the memory cell 40 includes a nonvolatile memory element 30a. The terminal 31 is coupled to the source line SL, the terminal 32 is coupled to the bit line BL, and the electrode 33 is coupled to the word line WL. The nonvolatile memory element 30a is the nonvolatile memory element 107 of the sixth embodiment. Since the nonvolatile memory element 107 has the functions of a transistor and a magnetoresistive element, an FET for a switch becomes unnecessary in the memory cell 40. Therefore, the occupancy area is reduced.

The first variation of the sixth embodiment uses the nonvolatile memory element 30a of the sixth embodiment, and connects one of the free layer 10 and the pin layer 18 to the bit line BL. The other of the free layer 10 and the pin layer 18 is coupled to the source line SL. The piezoelectric electrode 24 is coupled to the word line WL. Such a structure achieves the memory cell 40 without a switch.

In the sixth embodiment and the variation thereof, as in the second embodiment, the piezoelectric electrode 24 is located so as to surround the piezoelectric substance 22, and the direction of the dielectric polarization is in the −r direction or the +r direction. As in the first variation of the second embodiment, the piezoelectric electrodes 24a and 24b may be located at the both sides of the piezoelectric substance 22 in the z direction, and the direction of the dielectric polarization of the piezoelectric substance 22 may be in the +z direction or the −z direction.

The sixth embodiment and the variation thereof ma be applied to the structure of the first embodiment.

Figure 29A:
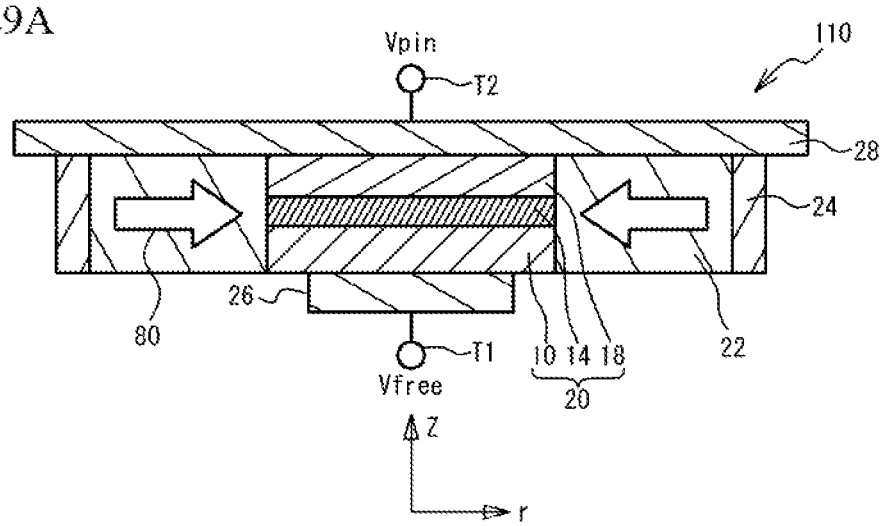
FIG. 29A and FIG. 29B are cross-sectional views of magnetoresistive elements in accordance with first and second comparative examples, respectively.
Figure 29B:
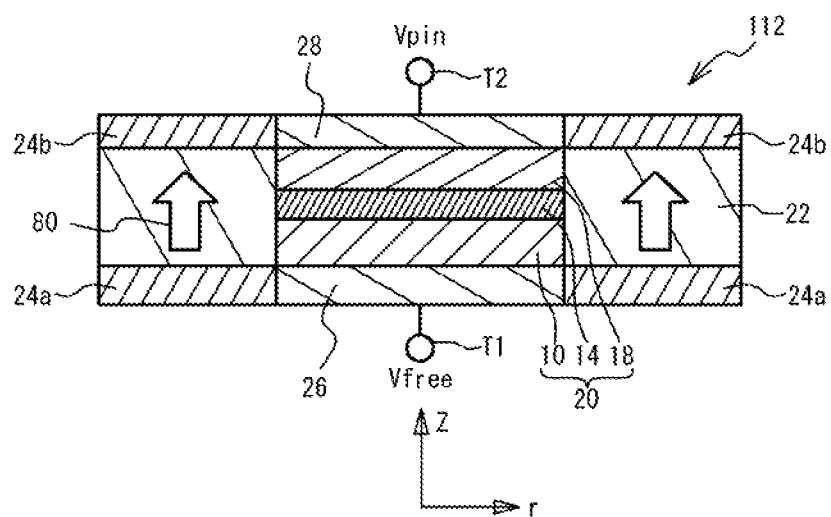

To describe advantages of the second through sixth embodiments and the variations thereof, a description will be given of a first comparative example and a second comparative example. FIG. 29A and FIG. 29B are cross-sectional views of magnetoresistive elements in accordance with the first and second comparative examples, respectively. As illustrated in FIG. 29A in the magnetoresistive element 110 of the first comparative example, the pin layer electrode 28 is electrically connected to the piezoelectric electrode 24. Other structures are the same as those of the second, embodiment, and the description thereof is thus omitted.

In the magnetoresistive element 110, when the parallel state is rewritten to the antiparallel state, a voltage is applied to the terminal T1 and the terminal T2 so that Vpin−Vfiee>0. The voltage Vpin is applied to die piezoelectric electrode 24 electrically connected to the pin layer electrode 28. A positive voltage with respect to the free layer electrode 26 is applied to the piezoelectric electrode 24. An electric field in the same direction as the direction 80 of the dielectric polarization is applied in the piezoelectric substance 22. Accordingly, a pressure in the −r direction is applied to the free layer 10 as in FIG. 4A. When the magnetization direction of the magnetostrictive layer in the free layer 10 is in the z direction and the magnetostrictive coefficient is negative, the magnetization easy plane of the magnetostrictive layer is in the xy plane. Accordingly, as described in FIG. 4B, the magnetization direction of the free layer 10 is reversed by small current.

On the other hand, when the antiparallel state is rewritten to the parallel state, a voltage is applied to the terminal T1 and the terminal T2 so that Vpin−Vfree<0. Unlike FIG. 4B, a negative voltage with respect to the free layer electrode 26 is applied to the piezoelectric electrode 24. An electric field in the direction opposite to the direction 80 of the dielectric polarization is applied in the piezoelectric substance 22, and a pressure in the +r direction is applied to the free layer 10. The magnetization easy plane of the magnetostrictive layer is not in the xy plane. Thus, the current for the magnetization reversal is not reduced.

As illustrated in FIG. 29B, in a magnetoresistive element 112 of the second comparative example, the free layer electrode 26 is electrically connected to the piezoelectric electrode 24a, and the pin layer electrode 28 is electrically connected to the piezoelectric electrode 24b. Other structures are the same as those of the second embodiment, and the description thereof is thus omitted.

In the magnetoresistive element 112, when the parallel state is rewritten to the antiparallel state, a voltage is applied to the terminal T1 and the terminal T2 so that Vpin−Vfree>0. A positive voltage with respect to the piezoelectric electrode 24a is applied to the piezoelectric electrode 24b. An electric field in the same direction as the direction 80 of the dielectric polarization is applied in the piezoelectric substance 22. Accordingly, as in FIG. 7A, a pressure in the −r direction is applied to the free layer 10, and the magnetization direction of the free layer 10 is reversed by small current.

On the other hand, when the antiparallel state is rewritten to the parallel state, a voltage is applied to the terminal T1 and the terminal T2 so that Vpin−Vfree<0. Unlike FIG. 7B, a negative voltage with respect to the piezoelectric electrode 24a is applied to the piezoelectric electrode 24b. An electric field in the direction opposite to the direction 80 of the dielectric polarization is applied in the piezoelectric substance 22. Thus, the current for the magnetization reversal is not reduced.

As described above, in the first and second comparative examples, the current consumed for one of the magnetization reversals is reduced, but the current consumed for the other of the magnetization reversals is not reduced.

In contrast to the first and second comparative examples described above, in the second embodiment and the variations thereof as illustrated in FIG. 3A through FIG. 8B, a voltage different from the voltage applied to the free layer 10 and the voltage applied to the pin layer 18 is applied to the piezoelectric electrodes 24, 24a, and 24b. Thus, in both cases where the parallel state is rewritten to the antiparallel state and where the antiparallel state is rewritten to the parallel state, the current for the magnetization reversal is reduced.

Additionally, in the second embodiment, as illustrated in FIG. 4A and FIG. 5A, when Vpin−Vfree>0, Vferr−Vfree>0. As illustrated in FIG. 4B and FIG. 5B, even when Vpin−Vfree<0, Vferr−Vfree>0. As described above, when the polarity of the voltage applied to the pin layer 18 with respect to the free layer 10 reverses, the polarity of the voltage applied to the piezoelectric electrode 24 with respect to the free layer 10 does not change. Accordingly, the direction of the electric field in the piezoelectric substance 22 is the same between the case where the parallel state is rewritten to the antiparallel state and the case where the antiparallel state is rewritten to the parallel state. Therefore, the current for the magnetization reversal is reduced in both cases.

Furthermore, in the first variation of the second embodiment, as illustrated in FIG. 7A and FIG. 8A, when Vpin−Vfree>0. Vferr1−Vferr2>0. As illustrated in FIG. 7B and FIG. 8B, even when Vpin−Vfree<0, Vferr−Vferr2>0. When the polarity of the voltage applied to the pin layer 18 with respect to the free layer 10 reverses, the polarity of the voltage applied to the electrode 24b (a second electrode) with respect to the electrode 24a (a first electrode) does not change. The current for the magnetization reversal is reduced in both cases.

Voltages Vpin, Vfree, Vferr, Vferr1, and Vferr2 are applied by, for example, the controller 45 illustrated in FIG. 16 of the third embodiment.

In the first through sixth embodiments and the variations thereof, the free layer 10 includes the magnetostrictive layer 11 and the ferromagnetic layer 12, but the ferromagnetic layer 12 may not be necessarily included.

Although preferred embodiments of the present invention have been described so far, the present invention is not limited to those particular embodiments, and various changes and modifications may be made to them within the scope of the invention claimed herein.

DESCRIPTION OF REFERENCE NUMERALS 10 free layer
11 magnetostrictive layer
12, 16 ferromagnetic layer
14 tunnel barrier layer
14a non-magnetic metal layer
15, 61 piezoresistor
17 magnetization fixed layer
18 pin layer
20 magnetoresistive layer
22, 62 piezoelectric substance
24, 24a, 24b piezoelectric electrode
26 free layer electrode
28 pin layer electrode
51 channel
52 gate insulating film
53 polysilicon layer
54 metal layer
55 gate
56, 66 source
58, 68 drain
64 gate electrode
71a, 71b inverter
72 bistable circuit
80, 82 direction of dielectric polarization

The invention claimed is:

1. A magnetoresistive element comprising:
a free layer that includes a magnetostrictive layer containing a magnetostrictive material;
a pin layer that includes a first ferromagnetic layer;
a thin film that is located between the pin layer and the free layer;
a piezoelectric substance that is located so as to surround at least a part of the magnetostrictive layer from a direction intersecting with a stacking direction of the free layer and the pin layer and applies a pressure to the magnetostrictive layer; and
an electrode that is capable of applying a voltage different from a voltage applied to the free layer and a voltage applied to the pin layer and applies a voltage to the piezoelectric substance so that the piezoelectric substance applies a pressure to the magnetostrictive layer in an identical direction when a parallel state is rewritten to an antiparallel state and when the antiparallel state is rewritten to the parallel state, a magnetization direction of the free layer being parallel to that of the pin layer in the parallel state, the magnetization direction of the free layer being opposite to that of the pin layer in the antiparallel state.

2. The magnetoresistive element according to claim 1, wherein
the electrode includes a first electrode and a second electrode located at both sides in the stacking direction with respect to the piezoelectric substance, and
the piezoelectric substance is dielectrically polarized in the stacking direction.

3. The magnetoresistive element according to claim 2, wherein
when a polarity of a voltage applied to the pin layer with respect to the free layer reverses, a polarity of a voltage applied to the second electrode with respect to the first electrode does not change.

4. The magnetoresistive element according to claim 1, wherein
the free layer includes a second ferromagnetic layer magnetically coupled to the magnetostrictive layer so that a magnetization direction of the second ferromagnetic layer is reversed when a magnetization of the magnetostrictive layer is reversed.

5. The magnetoresistive element according to claim 1, wherein
the magnetostrictive layer changes a direction of a magnetization easy axis thereof by application of pressure and reverses a magnetization direction of the free layer.

6. The magnetoresistive element according to claim 5, wherein
the magnetization direction of the free layer is reversed by spin-transfer-torque current-induced magnetization switching when the direction of the magnetization easy axis of the magnetostrictive layer changes.

7. The magnetoresistive element according to claim 1, wherein
the thin film includes a tunnel barrier insulating layer or a non-magnetic metal layer.

8. A memory circuit comprising:
the magnetoresistive element according to claim 7;
a bit line to which one of the free layer and the pin layer is coupled;
a switch coupled to another of the free layer and the pin layer;
a source line coupled to the another of the free layer and the pin layer through the switch;
a word line to which a control terminal controlling the switch is coupled; and
a control line to which the electrode is coupled.

9. The magnetoresistive element according to claim 1, wherein
the thin film includes a piezoresistor, and
the piezoelectric substance applies a pressure to the piezoresistor.

10. A memory circuit comprising:
the magnetoresistive element according to claim 9;
a bit line to which one of the free layer and the pin layer is coupled;
a source line coupled to another of the free layer and the pin layer; and
a word line coupled to the electrode.

11. The magnetoresistive element according to claim 1, wherein
the piezoelectric substance is located outside the at least the part of the magnetostrictive layer in a plurality of directions, and the plurality of directions intersects with the stacking direction and include two intersecting direction.

12. The magnetoresistive element according to claim 11, wherein
the electrode is located outside at least a part of the piezoelectric substance in the plurality of directions, and
the piezoelectric substance is dielectrically polarized in a direction from the magnetostrictive layer to the electrode or a direction from the electrode to the magnetostrictive layer.

13. The magnetoresistive element according to claim 12, wherein when a polarity of a voltage applied to the pin layer with respect to the free layer reverses, a polarity of a voltage applied to the electrode with respect to the free layer does not change.

14. A memory circuit comprising:
a magnetoresistive element including:
   a free layer that includes a magnetostrictive layer containing a magnetostrictive material;
   a pin layer that includes a first ferromagnetic layer;
   a thin film that is located between the pin layer and the free layer;
   a piezoelectric substance that is located so as to surround at least a part of the magnetostrictive layer from a direction intersecting with a stacking direction of the free layer and the pin layer, and applies a pressure to the magnetostrictive layer; and
   an electrode that is capable of applying a voltage different from a voltage applied to the free layer and a voltage applied to the pin layer, and applies a voltage to the piezoelectric substance so that the piezoelectric substance applies a pressure to the magnetostrictive layer in an identical direction when a parallel state is rewritten to an antiparallel state and when the antiparallel state is rewritten to the parallel state, a magnetization direction of the free layer being parallel to that of the pin layer in the parallel state, the magnetization direction of the free layer being opposite to that of the pin layer in the antiparallel state; and
a transistor including:
   a source and a drain, one of the source and the drain being coupled to one of the free layer and the pin layer;
   a channel that is located between the source and the drain and through which a carrier conducts from the source to the drain; and
   a gate that surrounds at least a part of the channel from the intersecting direction, wherein
   the source, the channel, and the drain are stacked in the stacking direction.

15. The memory circuit according to claim 14, wherein the channel is a piezoresistor, and
the gate includes a piezoelectric substance that applies a pressure to the channel from a direction intersecting with a direction in which the carrier conducts.

* * * * *